(12) United States Patent
Lablans

(10) Patent No.: US 9,203,436 B2
(45) Date of Patent: Dec. 1, 2015

(54) ERROR CORRECTION IN MULTI-VALUED (P,K) CODES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 2637 days.

(21) Appl. No.: 11/775,963

(22) Filed: Jul. 11, 2007

(65) Prior Publication Data

US 2008/0016432 A1    Jan. 17, 2008

Related U.S. Application Data

(63) Continuation-in-part of application No. 11/739,189, filed on Apr. 24, 2007, and a continuation-in-part of application No. 11/743,893, filed on May 3, 2007.

(60) Provisional application No. 60/807,087, filed on Jul. 12, 2006, provisional application No. 60/821,980, filed on Aug. 10, 2006.

(51) Int. Cl.
*H03M 13/00* (2006.01)
*H03M 13/15* (2006.01)

(52) U.S. Cl.
CPC ............ *H03M 13/151* (2013.01); *H03M 13/15* (2013.01); *H03M 13/152* (2013.01); *H03M 13/154* (2013.01); *H03M 13/157* (2013.01); *H03M 13/158* (2013.01); *H03M 13/1515* (2013.01); *H03M 13/1545* (2013.01); *H03M 13/1575* (2013.01); *H03M 13/1585* (2013.01); *H03M 13/616* (2013.01)

(58) Field of Classification Search
CPC . H03M 13/151; H03M 13/15; H03M 13/152; H03M 13/154; H03M 13/157; H03M 13/575
USPC .......................................... 714/781, 755, 756
See application file for complete search history.

(56) References Cited

U.S. PATENT DOCUMENTS

| | | | | | |
|---|---|---|---|---|---|
| 3,638,182 | A | * | 1/1972 | Burton et al. | 714/761 |
| 3,648,239 | A | * | 3/1972 | Carter et al. | 714/758 |
| 4,099,160 | A | * | 7/1978 | Flagg | 714/785 |

(Continued)

OTHER PUBLICATIONS

Keith Matthews, Elementary Linear Algebra, 1991; http://www.numbertheory.org/book/; pp. 1-21.*

(Continued)

*Primary Examiner* — Joseph D Torres

(57) ABSTRACT

Methods, apparatus and systems for error correction of n-valued symbols in (p,k) codewords including Reed Solomon codes of p n-valued symbols with n>2 and k information symbols have been disclosed. Coders and decoders using a Linear Feedback Shift Registers (LFSR) are applied. An LFSR can be in Fibonacci or Galois configuration. Errors can be corrected by execution of an n-valued expression in a deterministic way. Error correcting methods using Galois arithmetic are disclosed. Methods using Cramer's rule are also disclosed. Deterministic error correction methods based on known symbols in error are provided, making first determining error magnitudes not necessary. An error location methods using up and down state tracking is provided. Methods and apparatus executing the methods with binary circuits are also disclosed. Systems using the error correcting methods, including communication systems and data storage systems are also provided.

18 Claims, 15 Drawing Sheets

(56) References Cited

U.S. PATENT DOCUMENTS

| | | | |
|---|---|---|---|
| 4,142,174 A * | 2/1979 | Chen et al. ............... | 714/784 |
| 4,304,962 A | 12/1981 | Fracassi et al. | |
| 4,320,510 A * | 3/1982 | Kojima .................. | 714/755 |
| 4,402,045 A * | 8/1983 | Krol ..................... | 712/29 |
| 4,413,339 A * | 11/1983 | Riggle et al. ............ | 714/765 |
| 4,494,234 A * | 1/1985 | Patel .................... | 714/765 |
| 4,498,175 A * | 2/1985 | Nagumo et al. .......... | 714/756 |
| 4,527,269 A * | 7/1985 | Wood et al. ............. | 714/703 |
| 4,566,105 A * | 1/1986 | Oisel et al. ............. | 714/756 |
| 4,567,594 A * | 1/1986 | Deodhar ................. | 714/769 |
| 4,633,470 A * | 12/1986 | Welch et al. ............ | 714/781 |
| 4,747,103 A * | 5/1988 | Iwamura et al. .......... | 714/755 |
| 4,873,688 A * | 10/1989 | Maki et al. ............. | 714/784 |
| 4,937,829 A * | 6/1990 | Kadokawa .............. | 714/757 |
| 5,185,711 A * | 2/1993 | Hattori .................. | 708/492 |
| 5,291,496 A * | 3/1994 | Andaleon et al. ......... | 714/703 |
| 5,297,153 A | 3/1994 | Baggen et al. | |
| 5,315,600 A * | 5/1994 | Iwamura et al. .......... | 714/757 |
| 5,325,373 A * | 6/1994 | Iwamura et al. .......... | 714/784 |
| 5,343,481 A | 8/1994 | Kraft | |
| 5,355,412 A * | 10/1994 | Kangas .................. | 713/161 |
| 5,414,719 A * | 5/1995 | Iwaki et al. ............. | 714/785 |
| 5,430,739 A * | 7/1995 | Wei et al. ............... | 714/784 |
| 5,440,570 A * | 8/1995 | Wei et al. ............... | 714/782 |
| 5,479,416 A * | 12/1995 | Snodgrass et al. ........ | 714/785 |
| 5,517,509 A * | 5/1996 | Yoneda .................. | 714/785 |
| 5,541,937 A * | 7/1996 | Iwamura ................. | 714/785 |
| 5,689,727 A * | 11/1997 | Bonke et al. ............ | 710/20 |
| 5,712,861 A * | 1/1998 | Inoue et al. ............. | 714/752 |
| 5,715,262 A * | 2/1998 | Gupta ................... | 714/784 |
| 5,754,563 A * | 5/1998 | White ................... | 714/757 |
| 5,771,244 A * | 6/1998 | Reed et al. .............. | 714/752 |
| 5,974,580 A * | 10/1999 | Zook et al. ............. | 714/755 |
| 6,145,110 A * | 11/2000 | Khayrallah ............. | 714/752 |
| 6,477,678 B1 * | 11/2002 | Fang et al. .............. | 714/755 |
| 6,732,325 B1 * | 5/2004 | Tash et al. .............. | 714/785 |
| 6,915,478 B2 | 7/2005 | Cox | |
| 7,089,464 B2 * | 8/2006 | Herley et al. ............ | 714/712 |
| 7,206,992 B2 | 4/2007 | Xin | |
| 7,539,927 B2 * | 5/2009 | Lee et al. ............... | 714/784 |
| 2009/0172501 A1 * | 7/2009 | Lablans ................. | 714/784 |

OTHER PUBLICATIONS

Hank Wallace, Error Detection and Correction Using the BCH Code, 2001, available from the Internet at www.aqdi.com/bch.pdf.
Bernard Sklar, Reed-Solomon Codes, available from the Internet at: http://www.informit.com/content/images/art_sklar7_reed-solomon/elementLinks/art_sklar7_reed-solomon.pdf.

* cited by examiner

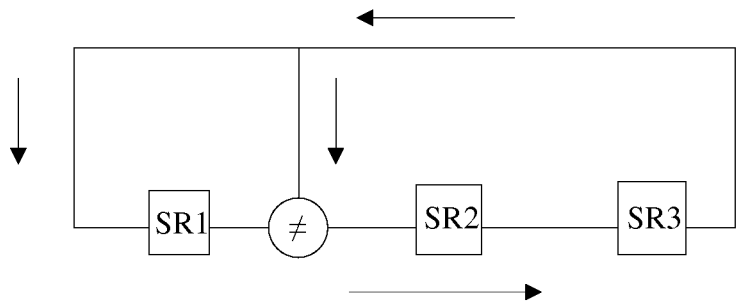

FIG. 9
PRIOR ART

| + | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | $\alpha^0$ | $\alpha^1$ | $\alpha^2$ | $\alpha^3$ | $\alpha^4$ | $\alpha^5$ | $\alpha^6$ |
| $\alpha^0$ | $\alpha^0$ | 0 | $\alpha^3$ | $\alpha^6$ | $\alpha^1$ | $\alpha^5$ | $\alpha^4$ | $\alpha^2$ |
| $\alpha^1$ | $\alpha^1$ | $\alpha^3$ | 0 | $\alpha^4$ | $\alpha^0$ | $\alpha^2$ | $\alpha^6$ | $\alpha^5$ |
| $\alpha^2$ | $\alpha^2$ | $\alpha^6$ | $\alpha^4$ | 0 | $\alpha^5$ | $\alpha^1$ | $\alpha^3$ | $\alpha^0$ |
| $\alpha^3$ | $\alpha^3$ | $\alpha^1$ | $\alpha^0$ | $\alpha^5$ | 0 | $\alpha^6$ | $\alpha^2$ | $\alpha^4$ |
| $\alpha^4$ | $\alpha^4$ | $\alpha^5$ | $\alpha^2$ | $\alpha^1$ | $\alpha^6$ | 0 | $\alpha^0$ | $\alpha^3$ |
| $\alpha^5$ | $\alpha^5$ | $\alpha^4$ | $\alpha^6$ | $\alpha^3$ | $\alpha^2$ | $\alpha^0$ | 0 | $\alpha^1$ |
| $\alpha^6$ | $\alpha^6$ | $\alpha^2$ | $\alpha^5$ | $\alpha^0$ | $\alpha^4$ | $\alpha^3$ | $\alpha^1$ | 0 |

FIG. 10
PRIOR ART

| × | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | 0 | 0 | 0 | 0 | 0 | 0 | 0 |
| $\alpha^0$ | 0 | $\alpha^0$ | $\alpha^1$ | $\alpha^2$ | $\alpha^3$ | $\alpha^4$ | $\alpha^5$ | $\alpha^6$ |
| $\alpha^1$ | 0 | $\alpha^1$ | $\alpha^2$ | $\alpha^3$ | $\alpha^4$ | $\alpha^5$ | $\alpha^6$ | $\alpha^0$ |
| $\alpha^2$ | 0 | $\alpha^2$ | $\alpha^3$ | $\alpha^4$ | $\alpha^5$ | $\alpha^6$ | $\alpha^0$ | $\alpha^1$ |
| $\alpha^3$ | 0 | $\alpha^3$ | $\alpha^4$ | $\alpha^5$ | $\alpha^6$ | $\alpha^0$ | $\alpha^1$ | $\alpha^2$ |
| $\alpha^4$ | 0 | $\alpha^4$ | $\alpha^5$ | $\alpha^6$ | $\alpha^0$ | $\alpha^1$ | $\alpha^2$ | $\alpha^3$ |
| $\alpha^5$ | 0 | $\alpha^5$ | $\alpha^6$ | $\alpha^0$ | $\alpha^1$ | $\alpha^2$ | $\alpha^3$ | $\alpha^4$ |
| $\alpha^6$ | 0 | $\alpha^6$ | $\alpha^0$ | $\alpha^1$ | $\alpha^2$ | $\alpha^3$ | $\alpha^4$ | $\alpha^5$ |

FIG. 11
PRIOR ART

| ÷ | 0 | $\alpha^0$ | $\alpha^1$ | $\alpha^2$ | $\alpha^3$ | $\alpha^4$ | $\alpha^5$ | $\alpha^6$ |
|---|---|---|---|---|---|---|---|---|
| 0 | 0 | 0 | 0 | 0 | 0 | 0 | 0 | 0 |
| $\alpha^0$ | 0 | $\alpha^0$ | $\alpha^6$ | $\alpha^5$ | $\alpha^4$ | $\alpha^3$ | $\alpha^2$ | $\alpha^1$ |
| $\alpha^1$ | 0 | $\alpha^1$ | $\alpha^0$ | $\alpha^6$ | $\alpha^5$ | $\alpha^4$ | $\alpha^3$ | $\alpha^2$ |
| $\alpha^2$ | 0 | $\alpha^2$ | $\alpha^1$ | $\alpha^0$ | $\alpha^6$ | $\alpha^5$ | $\alpha^4$ | $\alpha^3$ |
| $\alpha^3$ | 0 | $\alpha^3$ | $\alpha^2$ | $\alpha^1$ | $\alpha^0$ | $\alpha^6$ | $\alpha^5$ | $\alpha^4$ |
| $\alpha^4$ | 0 | $\alpha^4$ | $\alpha^3$ | $\alpha^2$ | $\alpha^1$ | $\alpha^0$ | $\alpha^6$ | $\alpha^5$ |
| $\alpha^5$ | 0 | $\alpha^5$ | $\alpha^4$ | $\alpha^3$ | $\alpha^2$ | $\alpha^1$ | $\alpha^0$ | $\alpha^6$ |
| $\alpha^6$ | 0 | $\alpha^6$ | $\alpha^5$ | $\alpha^4$ | $\alpha^3$ | $\alpha^2$ | $\alpha^1$ | $\alpha^0$ |

FIG. 14

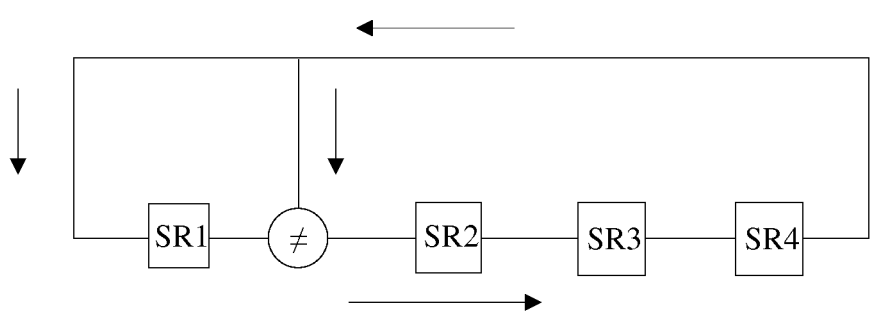

FIG. 15
PRIOR ART

| | | | | | | |
|---|---|---|---|---|---|---|
| start | 0 | 0 | 0 | 0 | 0 | 0 |
| 2 | a1 | 0 | a1 | 0 | 2a1 | a1 |
| 3 | a1+a2 | a1 | a1+a2 | a1+a2 | 4a1+2a2 | 4a1+a2 |
| 4 | 4a1+a2+a3 | a1+a2 | 2a1+a2+a3 | 4a1+a2+a3 | 6a1+4a2+2a3 | 4a2+a3 |
| 5 | 4a2+a3+a4 | 4a1+a2+a3 | a1+2a2+a3+a4 | 4a1+2a2+a3+a4 | 2a1+6a2+4a3+2a4 | 6a1+4a3+a4 |
| 6 | 6a1+4a3+a4+a5 | 4a2+a3+a4 | 3a1+a2+2a3+a4+a5 | 3a1+2a2+2a3+a4+a5 | 3a1+2a2+6a3+4a4+2a5 | 7a1+6a2+4a4+a5 |
| end | 7a1+6a2+4a4+a5+a6 | 6a1+4a3+a4+a5 | 7a1+3a2+a3+2a4+a5+a6 | 7a1+3a2+2a3+2a4+a5+a6 | 7a1+3a2+2a3+6a4+2a4+2a6 | a1+7a2+6 a3+4a5+a6 |

FIG. 22

| start | $7b_1+b_2+2b_4+b_5+a_5$ | $2b_1+5b_2+b_3+2b_5+a_4+a_6$ | $4b_2+7b_3+4b_4+b_5+a_3+2a_6$ | $b_1+2b_2+4b_3+b_4+b_5+a_2+a_6$ | $b_1+2b_3+b_4+a_1+a_6$ |
|---|---|---|---|---|---|
| 2 | $b_1+2b_3+b_4+a_6$ | $7b_1+b_2+2b_4+b_5+a_5$ | $4b_1+5b_2+4b_3+b_4+2b_5+a_4$ | $2b_1+4b_2+b_3+b_4+b_5+a_3$ | $2b_2+b_3+b_5+a_2$ |
| 3 | $2b_2+b_3+b_5$ | $b_1+2b_3+b_4+a_6$ | $7b_1+4b_2+b_3+2b_4+a_5$ | $4b_1+b_2+b_3+b_4+a_4$ | $2b_1+b_2+b_4+a_3$ |
| 4 | $2b_1+b_2+b_4$ | $2b_2+b_3+b_5$ | $4b_1+b_2+2b_3+a_6$ | $b_1+b_2+b_3+a_5$ | $b_1+b_3+a_4$ |
| 5 | $b_1+b_3$ | $2b_1+b_2+b_4$ | $b_1+2b_2+b_5$ | $b_1+b_2+a_6$ | $b_2+a_5$ |
| 6 | $b_2$ | $b_1+b_3$ | $2b_1+b_4$ | $b_1+b_5$ | $b_1+a_6$ |
| end | $b_1$ | $b_2$ | $b_3$ | $b_4$ | $b_5$ |

| bits | weight | label |
|---|---|---|
| 1 0 0 0 0 0 1 0 0 0 0 0 1 0 0 0 0 0 1 0 0 0 0 0 1 1 0 1 1 1 1 1 1 1 1 1 | 21 | a5 |
| 1 1 1 1 1 1 0 0 0 0 0 1 0 0 0 0 0 1 0 0 0 0 0 1 0 0 0 0 0 1 1 0 1 1 1 1 | 21 | a6 |
| 0 1 0 0 0 0 0 1 0 0 0 0 0 1 0 0 0 0 0 1 1 0 1 1 1 1 1 1 1 1 1 1 1 1 1 0 | 18 | a4 |
| 0 0 1 0 0 0 0 0 1 0 0 0 0 0 1 1 0 1 1 1 1 1 1 1 1 1 1 1 1 0 0 1 1 1 1 1 | 15 | a3 |
| 1 1 1 1 1 1 1 1 1 1 1 0 0 0 0 1 1 0 0 0 0 1 1 0 0 0 0 1 1 1 0 1 1 1 1 1 | 13 | a6 b5 |
| 1 1 0 0 0 0 1 1 0 0 0 0 1 1 0 0 0 0 1 1 0 1 1 1 1 1 1 1 1 1 1 1 1 1 1 1 | 13 | a4 a5 |
| 1 1 1 1 1 1 1 0 0 0 0 1 1 0 0 0 0 1 1 0 0 0 0 1 1 0 1 1 1 1 1 1 1 1 1 1 | 13 | a5 a6 |
| 0 0 0 1 0 0 0 0 0 1 1 0 1 1 1 1 1 1 1 1 1 1 1 0 0 1 1 1 1 1 0 1 1 1 1 1 | 12 | a2 |
| 1 1 1 1 1 1 1 1 0 0 1 1 1 1 1 0 1 0 0 0 1 0 1 0 0 0 1 0 1 1 0 1 1 1 1 1 | 12 | a6 b4 |
| 1 1 1 1 0 0 1 1 1 1 1 0 1 0 0 0 1 0 1 0 0 0 1 0 1 1 0 1 1 1 1 1 1 1 1 1 | 12 | a5 b5 |
| 0 1 1 1 1 1 0 1 1 1 1 1 1 0 0 1 1 1 1 1 0 0 1 0 0 1 0 0 1 1 0 1 1 1 1 1 | 11 | a6 b3 |
| 0 1 1 1 1 1 0 1 0 0 0 1 0 1 0 0 0 1 0 1 1 0 1 1 1 1 1 1 1 1 1 1 1 1 1 1 | 11 | a4 a6 |
| 1 0 1 1 1 1 1 1 0 0 1 1 1 1 0 0 1 0 0 1 0 0 1 1 0 1 1 1 1 1 1 1 1 1 1 1 | 10 | a5 b4 |
| 0 1 1 0 0 0 0 1 1 0 0 0 0 1 1 1 0 1 1 1 1 1 1 1 1 1 1 1 1 1 1 1 1 1 1 1 | 10 | a3 a4 |
| 1 0 1 0 0 0 1 0 1 0 0 0 1 0 1 1 0 1 1 1 1 1 1 1 1 1 1 1 1 1 1 1 1 1 1 1 | 10 | a3 a5 |
| 1 1 1 1 0 0 1 1 1 1 0 0 1 0 0 1 0 0 1 1 0 1 1 1 1 1 1 1 1 1 1 1 1 1 1 1 | 9 | a4 b5 |
| 0 0 0 0 1 1 0 1 1 1 1 1 1 1 1 1 1 0 0 1 1 1 1 1 0 1 1 1 1 1 1 1 1 1 1 1 | 8 | a1 |
| 0 1 1 1 1 1 0 0 1 0 0 1 0 0 1 1 0 1 1 1 1 1 1 1 1 1 1 1 1 1 1 1 1 1 1 1 | 8 | a3 a6 |
| 1 1 1 1 1 0 0 1 1 1 1 1 0 0 0 0 1 1 1 1 1 1 1 1 1 1 1 1 1 1 0 0 1 1 1 1 | 7 | a3 b5 |
| 0 0 1 1 0 0 0 0 1 1 0 1 1 1 1 1 1 1 1 1 1 1 1 1 1 1 1 1 1 1 1 1 1 1 1 1 | 7 | a2 a3 |
| 0 1 0 1 0 0 0 1 0 1 1 0 1 1 1 1 1 1 1 1 1 1 1 1 1 1 1 1 1 1 1 1 1 1 1 1 | 7 | a2 a4 |
| 1 0 0 1 0 0 1 0 0 1 1 0 1 1 1 1 1 1 1 1 1 1 1 1 1 1 1 1 1 1 1 1 1 1 1 1 | 7 | a2 a5 |
| 0 1 1 1 1 1 0 0 0 1 1 1 1 1 1 1 1 1 1 1 1 1 0 0 1 1 1 1 0 1 1 1 1 1 1 1 | 7 | a2 a6 |
| 1 0 0 0 1 1 1 1 1 1 1 1 1 1 1 1 0 0 1 1 1 1 1 0 1 1 1 1 1 1 1 1 1 1 1 1 | 6 | a1 a5 |
| 1 1 1 1 0 0 1 1 1 1 1 0 1 1 1 1 1 1 1 1 1 1 1 0 0 1 1 1 1 1 0 1 1 1 1 1 | 6 | a2 b5 |
| 1 0 1 1 1 1 1 1 1 0 0 1 1 1 1 0 1 1 1 1 1 1 1 1 1 1 1 0 0 1 1 1 1 1 1 1 | 6 | a3 b4 |
| 0 1 1 1 1 1 0 1 1 1 1 1 0 0 1 1 1 1 0 1 1 1 1 1 1 1 1 1 1 1 1 1 1 1 1 0 | 6 | a4 b3 |
| 1 1 1 1 1 1 1 1 0 0 1 1 1 1 1 0 0 0 1 1 1 1 1 1 1 1 1 1 1 1 1 1 1 1 1 0 | 6 | a4 b4 |
| 1 1 1 1 0 0 1 1 1 1 1 0 1 1 1 1 1 1 0 0 1 1 1 1 1 0 1 1 1 1 1 1 1 1 1 1 | 6 | a5 b2 |
| 1 1 1 1 1 1 1 1 1 1 0 0 1 1 1 1 0 1 1 1 1 1 1 1 1 0 0 1 1 1 1 0 1 1 1 1 | 6 | a6 b1 |
| 0 1 1 1 1 1 1 0 1 1 1 1 1 1 1 1 1 1 1 1 1 0 0 1 1 1 1 0 1 1 1 1 1 1 1 1 | 5 | a1 a6 |
| 0 1 1 1 1 1 0 1 1 1 1 1 1 1 1 1 1 1 1 1 1 0 0 1 1 1 1 0 1 1 1 1 1 1 1 1 | 5 | a2 b3 |
| 1 1 1 1 0 0 1 1 1 1 1 0 1 1 1 1 1 1 1 1 1 1 1 1 1 1 1 1 1 0 0 1 1 1 1 1 | 5 | a3 b2 |
| 1 1 1 1 0 0 1 1 1 1 1 0 1 1 1 1 1 1 1 1 1 1 1 1 1 1 1 1 1 0 0 1 1 1 1 1 | 5 | a3 b3 |
| 1 1 0 1 1 1 1 1 0 0 1 1 1 1 1 0 1 1 1 1 1 1 1 1 1 1 1 1 1 1 1 1 1 1 1 0 | 5 | a4 b1 |
| 1 1 1 1 1 1 1 1 1 1 1 1 0 0 1 1 1 1 0 0 0 1 1 1 1 1 1 1 1 1 1 1 1 1 1 1 | 5 | a5 b3 |
| 1 1 1 1 1 1 1 1 1 1 1 1 1 1 0 0 1 1 1 1 0 0 0 1 1 1 1 1 1 1 1 1 1 1 1 1 | 5 | a6 b2 |
| 0 0 0 1 1 1 0 1 1 1 1 1 1 1 1 1 1 1 1 1 1 1 1 1 1 1 1 1 1 1 1 1 1 1 1 1 | 4 | a1 a2 |
| 0 0 1 0 1 1 0 1 1 1 1 1 1 1 1 1 1 1 1 1 1 1 1 1 1 1 1 1 1 1 1 1 1 1 1 1 | 4 | a1 a3 |
| 0 1 0 0 1 1 0 1 1 1 1 1 1 1 1 1 1 1 1 1 1 1 1 1 1 1 1 1 1 1 1 1 1 1 1 1 | 4 | a1 a4 |
| 1 1 0 1 1 1 1 1 1 1 1 1 1 1 1 0 0 1 1 1 1 1 0 1 1 1 1 1 1 1 1 1 1 1 1 1 | 4 | a1 b4 |
| 1 0 1 1 1 1 1 1 1 1 1 1 1 1 1 1 0 0 1 1 1 1 1 0 1 1 1 1 1 1 1 1 1 1 1 1 | 4 | a2 b1 |
| 1 0 1 1 1 1 1 1 1 1 1 1 1 1 1 1 0 0 1 1 1 1 1 0 1 1 1 1 1 1 1 1 1 1 1 1 | 4 | a2 b4 |
| 1 1 1 1 0 0 1 1 1 1 1 0 1 1 1 1 1 1 1 1 1 1 1 1 1 1 1 1 1 1 1 1 1 1 1 0 | 4 | a4 b2 |
| 1 1 0 1 1 1 1 1 1 1 0 0 1 1 1 1 0 1 1 1 1 1 1 1 1 1 1 1 1 1 1 1 1 1 1 1 | 4 | a5 b1 |
| 1 1 1 1 1 1 1 1 1 1 1 1 1 1 0 0 1 1 1 1 1 0 1 1 1 1 1 1 1 1 1 1 1 1 1 1 | 3 | a1 b2 |
| 1 1 1 1 1 1 1 1 1 1 1 1 1 1 0 0 1 1 1 1 1 0 1 1 1 1 1 1 1 1 1 1 1 1 1 1 | 3 | a1 b5 |
| 1 1 1 1 0 0 1 1 1 1 1 0 1 1 1 1 1 1 1 1 1 1 1 1 1 1 1 1 1 1 1 1 1 1 1 1 | 3 | a2 b2 |
| 1 1 1 1 1 1 1 1 1 1 0 0 1 1 1 1 0 1 1 1 1 1 1 1 1 1 1 1 1 1 1 1 1 1 1 1 | 3 | a3 b1 |
| 0 1 1 1 1 0 1 1 1 1 1 1 1 1 1 1 1 1 1 1 1 1 1 1 1 1 1 1 1 1 1 1 1 1 1 1 | 2 | a1 b3 |
| 1 1 0 1 1 1 1 1 1 1 1 1 1 1 1 1 1 1 1 1 1 1 1 1 1 1 1 1 1 1 1 1 1 1 1 1 | 1 | a1 b1 |

FIG. 24

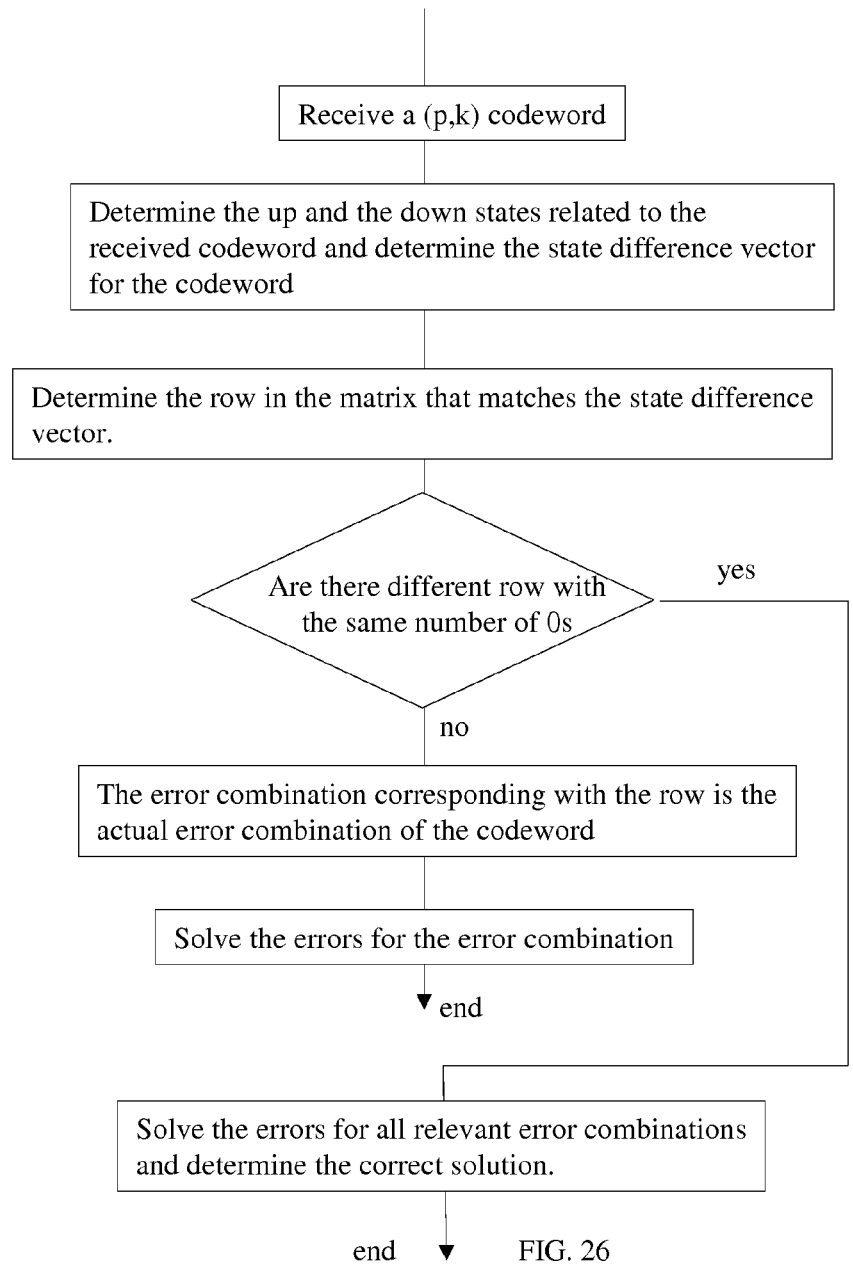

ERROR CORRECTION IN MULTI-VALUED (P,K) CODES

CROSS-REFERENCE TO RELATED APPLICATIONS

This application claims the benefit of U.S. Provisional Patent Application No. 60/807,087, filed Jul. 12, 2006, and U.S. Provisional Patent Application No. 60/821,980 filed Aug. 10, 2006 which are both incorporated herein by reference in their entirety. This application is a continuation in part of, and claims the benefit of priority of, U.S. patent application Ser. No. 11/739,189 filed Apr. 24, 2007 and U.S. patent application Ser. No. 11/743,893 filed May 3, 2007 which are both incorporated herein by reference in their entirety.

BACKGROUND OF THE INVENTION

The present invention relates to error correcting coding and decoding. More specifically it relates to correcting symbols in error in cyclic codes.

Error correction of digital codes is widely used in telecommunications and in transfer of information such as reading of data from storage media such as optical disks. Detection of errors can take place by analyzing symbols that were added to the information symbols during coding. The relation between information symbols and the added coding symbols is determined by a rule. If after reception of the symbols such relation between the symbols as provided by the rule no longer holds, it can be determined that some of the symbols are different or in error compared to the original symbols. Such a relationship may be a parity rule or a syndrome relationship. If the errors do not exceed a certain number within a defined number of symbols it is possible to identify and correct these errors. Known methods of creating error correcting codes and correction of errors are provided by BCH codes and the related Reed-Solomon (RS) codes. These are known as (p,k) codes having codewords of p n-valued symbols of which k symbols are information symbols.

Error-correction in (p,k) codes usually involves locating symbols in error, determining the magnitude of an error and determining the correct value or state of a symbol. Calculations in (p,k) codes such as RS codes can be time and/or resource consuming and may add to a coding latency.

Accordingly methods that can correct a symbol known to be in error in a faster or easier way are required.

SUMMARY OF THE INVENTION

One aspect of the present invention presents a novel method and apparatus that can rapidly detect and correct errors in codewords with an information rate grater than ½.

It is another aspect of the present invention to provide a method for coding a word of k n-valued information symbols into a codeword of p n-valued symbols.

It is a further aspect of the present invention to provide coding and error correcting decoding methods that can be applied for codewords of binary and for codewords of non-binary symbols.

It is a further aspect of the present invention to provide a method wherein the codewords are selected from sequence of a plurality of n-valued symbols generated by a Linear Feedback Shift Register (LFSR).

It is another aspect of the present invention to provide a method to create a plurality of codewords of p symbols wherein each codeword has at most k symbols in k positions in common with k symbols in k like positions in any other codeword from the plurality.

It is a further aspect of the present invention to provide a method for creating a corrected codeword from a changed codeword of k+2*t+1 n-valued symbols, wherein the changed codeword is created from a first codeword wherein up to t of its symbols may have changed.

It is another aspect of the present invention to provide methods to create equations that establish relations between symbols in a codeword.

It is a further aspect of the present invention to determine a calculated codeword by executing in a non-iterative fashion an n-valued logic expression.

It is a further aspect of the present invention to provide a method to determine if a calculated codeword is an appropriately corrected codeword.

It is another aspect of the present invention to determine a correct codeword when the location of errors in a codeword is known for non-binary symbols.

It is another aspect of the present invention to provide apparatus and systems that will implement the methods provided in the present invention.

DESCRIPTION OF THE DRAWINGS

FIG. 9 is a binary LFSR for generating elements of GF(8).

FIG. 10 is a truth table of an adder over GF(8).

FIG. 11 is a truth table of a multiplication over GF(8).

FIG. 14 is a truth table of inverter multipliers over GF(8).

FIG. 15 is a binary LFSR for generating elements of GF(16)

FIG. 22 shows intermediate states of a (p,k) coder in up mode in accordance with an aspect of the present invention.

FIG. 23 shows intermediate states of a (p,k) coder in down mode in accordance with an aspect of the present invention.

FIG. 24 is a state difference matrix of a (p,k) coder in accordance with an aspect of the present invention.

FIG. 25 shows steps of a method of error location in accordance with an aspect of the present invention.

FIG. 26 shows other steps of a method of error location in accordance with an aspect of the present invention.

DESCRIPTION OF A PREFERRED EMBODIMENT

Figure 1:
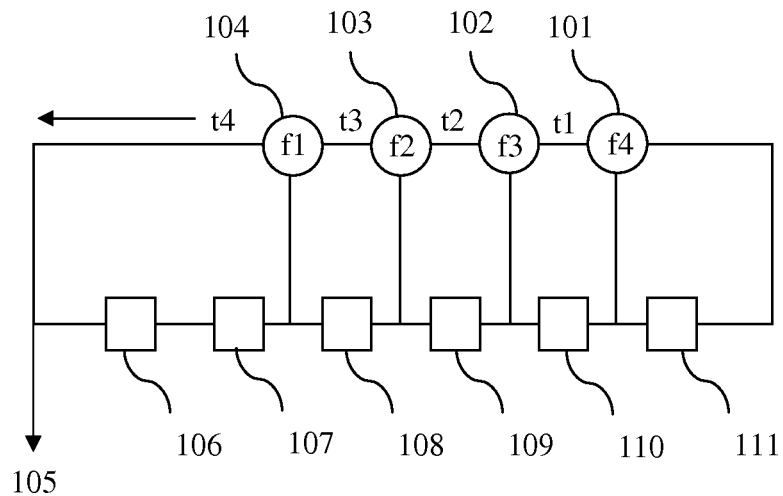
FIG. 1 is a diagram of an n-valued LFSR based sequence generator having no multipliers.

The inventor has shown in earlier inventions disclosed in U.S. patent application Ser. No. 11/739,189 filed Apr. 24, 2007 and U.S. patent application Ser. No. 11/743,893 filed May 3, 2007 which are both incorporated herein by reference in their entirety how to generate (p,k) codewords of p n-valued symbols with k n-valued symbols from coders in Galois and Fibonacci configuration. (p,k) codes of which a codeword has at most k symbols in common in corresponding positions with any other codeword of the (p,k) code have been disclosed.

Also (p,k) codes of which a codeword has at most (k–1) symbols in corresponding positions in common with any other codeword of the (p,k) code have been analyzed in the cited Patent Applications. These (p,k) codes are generally known as Reed Solomon codes. They are created by using a generating polynomial over GF(n) wherein the roots of the generating polynomial are usually consecutive roots of the field GF(n). It was shown by the inventor that one can generate n-valued Reed Solomon type codes with the (k–1) restriction by using for instance Galois LFSRs wherein n-valued inverters not being multipliers over GF(n) can be used. The same applies for (p,k) coders in Fibonacci configuration.

It was shown in the cited Patent Applications that one can solve errors and erasures in a received (p,k) codeword by making assumptions about the location of an error or erasure, determining a calculated codeword and comparing the calculated codeword with the received codeword. If the calculated (p,k) codeword has at most t symbols difference in corresponding positions with the received codeword then the calculated codeword may be considered the correct codeword under certain conditions. One is referred to the cited patent applications for details. These methods apply to (p,k) codes including RS codes, which will be called RS(p,k) codes. Different ways to determine a calculated codeword have been disclosed. One may also use means, such as solving an error location polynomial using syndromes to determine which symbols are in error.

Once the error location is known the provided methods can be applied to directly calculate or reconstruct the symbols in error. This approach then replaces the generally used Forney algorithm which requires determining a magnitude of an error and then modifying the symbol in error according to the magnitude of the error.

Coding and decoding of n-valued (p,k) codes can be performed well in binary form by codes over an extension binary field $GF(2^m)$. Aspects of the present invention therefore will be focused on these finite fields. However it is to be understood that the methods disclosed herein may in many cases also be applied in non-binary fields.

Creation of RS(p,k) codewords as part of a cyclic code is well known and is well documented in widely available textbooks. The Reed-Solomon codes are among the most widely applied and mostly use Galois arithmetic. The Linear Feedback Shift Register (LFSR) is generally regarded as an implementation of a polynomial over a finite field GF(n). The inventor in the present invention will use the n-valued LFSR as the starting point, sometimes referring back to GF(n) for instance for implementations of addition and multiplication over GF(n) in binary form.

There are different ways to generate (p,k) codewords with LFSR based circuits. One may use Galois or Fibonacci configuration n-valued LFSRs. This is described in books such as: Error Control Coding, $2^{nd}$ edition, by Shu Lin and Daniel J. Costello Jr.; Pearson Prentice Hall 2004. A worked out example of an 8-valued (7,3) RS code using a Galois configuration LFSR is described in instance in an article by Dr. Bernard Sklar, entitled Reed Solomon codes, which is available on-line at: http://www.informit.com/content/images/art_sklar7_reed-solomon/elementLinks/art_sklar7_reed-solomon.pdf. The (7,3) Reed Solomon code described in this article will be used herein.

Much of error-correcting coding and RS codes is based on Galois Field arithmetic. The theory of Galois Field arithmetic is known to persons skilled in the art and does not need further explanation here. The codes are usually identified as (n,k) wherein n is the total number of multi-valued symbols in a word and k is the number of information symbols. In the present invention the letter n will be used for the radix or value of a logic and accordingly the symbol p will be used for the number of n-valued symbols in a codeword. An n-valued symbol may be represented as a binary word of at least 2 binary symbols.

There are two ways to apply LFSRs: the Fibonacci and the Galois method. In essence Galois and Fibonacci configurations of Shift Register circuits for n-valued logic (n≥2) are equivalent. They are equivalent, but not identical and there are some differences that have to be taken into account. However, as shown by the inventor in U.S. patent application Ser. No. 11/696,261 filed: Apr. 4, 2007 entitled: BINARY AND N-VALUED LFSR AND LFCSR BASED SCRAMBLERS, DESCRAMBLERS, SEQUENCE GENERATORS AND DETECTORS IN GALOIS CONFIGURATION and incorporated herein by reference in its entirety, the differences are small enough that one can maintain that sequences generated by Fibonacci generators can also be generated by Galois configurations. Those configurations in general have a forbidden (degenerate) state of the shift register. However the degenerate states may not be a problem as they also form a codeword.

The inventor has also shown methods (called "word-methods") that can be applied to generate a full $n^p$ sequence instead of an $n^{p-1}$ sequence with the shift register based methods. The word-method is advantageous because one does not have to consider 'forbidden' words. One can create words in an order that can not be achieved with an LFSR. This is described in U.S. Provisional Patent Application entitled: The Creation And Detection Of Binary And Non-Binary Pseudo-Noise Sequences Not Using LFSR Circuits; Ser. No. 60/695,317 filed on Jun. 30, 2005 and in U.S. Non-provisional patent application entitled: The Creation And Detection Of Binary And Non-Binary Pseudo-Noise Sequences Not Using LFSR Circuits; Ser. No. 11/427,498, filed on Jun. 29, 2006, both of which are incorporated herein by reference.

Shift register methods are advantageous because they can generate sequences without having to store them. They require the availability of a starting position for the initial values of the shift register.

An important requirement for successful error-correcting of coded words is that each word can be uniquely determined. This means that sufficient symbols have to be added in such a way that each received word potentially with errors has an optimal "code distance" to its correct and error-free equivalent. Codewords should be designed to address a certain expected occurrence of errors. If a channel generates more errors than the error-correcting capacity of the code, correct identification of the codeword may no longer be possible. In traditional deterministic error correcting coding theory for block codes it is accepted that 2*t+1 symbol distance may allow correcting up to t symbol errors. This does not tell how these symbols need to be selected and positioned.

A codeword [c1 c2 c3 c4] comprised of 4 symbols can be changed to [c1 c2 c3 c4 s1 s2 s3] by adding additional symbols [s1 s2 s3]. How the additional code symbols are selected and how they are positioned into the codeword may vary. Different schemes are possible, contemplated and methods hereto will be described later.

The Coding

For the coding process as an illustrative example using 8-valued symbols, an (11,6) code will be used. This is not an RS code as p>n. However each codeword of the (11,6) code has at most 6 symbols in common in corresponding positions with any other codeword of the (11,6) code. The coding will be performed by an LFSR based coding method. For illustrative purposes the Fibonacci configuration of an LFSR will be used. The use of Galois configurations is also possible and is fully contemplated and an illustrative example will be provided later.

A diagram for the Fibonacci LFSR coder is shown in FIG. 1. It is comprised of a 6-element shift register with elements 106, 107, 108, 109, 110 and 111, of which each element can store an 8-valued element. In practice each element may also store a binary representation of an 8-valued symbol. Not shown, but assumed is a clock signal. Each shift register element has an input and an output. Each output of an element (except for the last one) is connected to the input of the next one (on its right in the example). Of some elements and at least of the last one the output is connected to an 8-valued reversible logic function via a feedback tap. On the occurrence of a clock pulse the content of the storage element is shifted 1 position to the right. As an illustrative example the LFSR of FIG. 1 is shown in a configuration with devices 101, 102, 103 and 104. Device 101 implements an 8-valued logic function f4, device 102 implements an 8-valued logic function f3, device 103 implements an 8-valued logic function f2 and device 101 implements an 8-valued logic function f4. The output of the device 104 implementing function 'f1' is made available on 105 and shifted into element 106.

Known art uses adders and multipliers in LFSRs. The inventor has created solutions using single reversible logic functions without multipliers. The methods how to substitute an n-valued adder with multipliers at its input by an n-valued function was shown in U.S. patent application entitled: Ternary and Multi-Value Digital Scramblers, Descramblers and Sequence Generators; Ser. No. 10/935,960 filed on Sep. 8, 2004, which is incorporated herein by reference in its entirety. All devices implementing a logic function in an LFSR in Fibonacci and Galois configurations will implement an n-valued reversible function.

By initializing the content of the shift register with the to be coded 6 8-valued symbols and running the LFSR for 4 clock pulses one then has generated an 11 symbol 8-valued word comprising the initial word and the added 5 symbols generated by the LFSR. A pseudo-noise sequence created by an LFSR of length of k elements generally has a length of $n^k-1$ symbols. Accordingly the 8-valued LFSR with 6 elements of FIG. 1 can potentially generate a unique sequence of 262144 8-valued symbols. More specifically a pn-sequence generated by an n-valued LFSR of k elements can also be created from ($n^k-1$) different overlapping words created from k n-valued symbols. This requires that the sequence is extended with the first (k−1) symbols of the sequence. The only word that is missing is the forbidden word, which depends on the selected n-valued functions in the LFSR. Except for the forbidden word one may say that any combination of k n-valued symbols is part of such a sequence. In Galois Field arithmetic the forbidden word is the all 0s word. When using non-Galois inverters or function different forbidden words may exist.

Consequently almost every word that is to be coded into a codeword (except the forbidden word) is in the sequence. One can actually create a sequence that also includes the forbidden word, by applying the 'word-method' which was invented by the inventor and described in the earlier cited Patent Applications 60/695,317 and Ser. No. 11/427,498.

One can create the 11-symbols 8-valued word by initiating the LFSR sequence generator with the 6-symbol word that needs to be transmitted and let the LFSR run for an additional 5 clock pulses to complete the 11 symbols codeword. One can then transmit the 11 symbol word. At the receiving side an LFSR identical to the coder is initiated with the first 6 symbols of the received codeword. The LFSR at the receiving side is run for 5 clock pulses. One can compare the thus created 11 symbol word with the received codeword. If both words are identical, then one may assume that the transmission was error free under the assumption of an upper bound of the symbol error ratio of the channel.

8-Valued Example

For illustrative purposes an 8-valued example will be provided. The structure of FIG. 2 will be applied, using the same length of LFSR and the same taps as FIG. 1 but using 8-valued adders and multipliers over GF(8). All shift register elements can manage 8-valued symbols (or their binary representation) and the function fp is an 8-valued logic function and the multipliers are also 8-valued. The 8-valued function is an 8-valued addition over $GF(2^3)$. Such functions are well documented in the known literature. The 8-valued addition function over $GF(2^3)$ that is used here is derived from the earlier cited article "Reed-Solomon Codes" by Dr. Bernard Sklar.

The following truth tables describe the 8-valued functions fp being an adder over GF(8).

| | | | | | b | | | | |
|---|---|---|---|---|---|---|---|---|---|
| | fp | 0 | 1 | 2 | 3 | 4 | 5 | 6 | 7 |
| | 0 | 0 | 1 | 2 | 3 | 4 | 5 | 6 | 7 |
| | 1 | 1 | 0 | 4 | 7 | 2 | 6 | 5 | 3 |
| a | 2 | 2 | 4 | 0 | 5 | 1 | 3 | 7 | 6 |
| | 3 | 3 | 7 | 5 | 0 | 6 | 2 | 4 | 1 |
| | 4 | 4 | 2 | 1 | 6 | 0 | 7 | 3 | 5 |
| | 5 | 5 | 6 | 3 | 2 | 7 | 0 | 1 | 4 |
| | 6 | 6 | 5 | 7 | 4 | 3 | 1 | 0 | 2 |
| | 7 | 7 | 3 | 6 | 1 | 5 | 4 | 2 | 0 |

Figure 2:
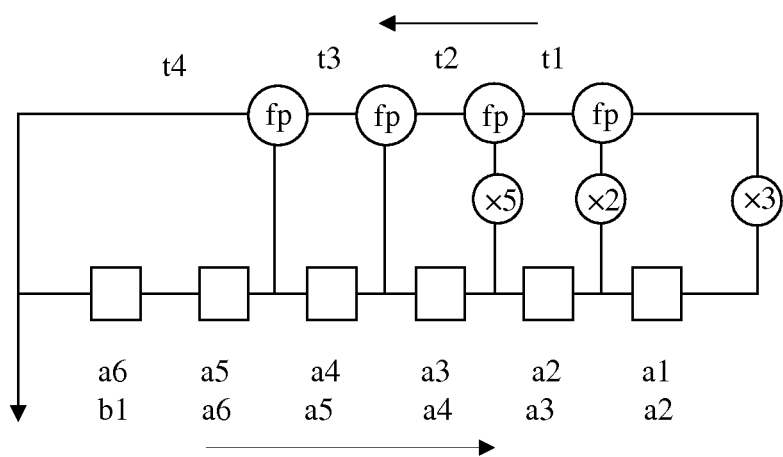
FIG. 2 is a diagram of an n-valued LFSR based sequence generator using multipliers.

The 8-valued configuration of the coder is shown in FIG. 2. The 8-valued constant multipliers 5, 2 and 3 are used.

The multiplication is also defined over GF(8). The truth table of the multiplication m8 over GF(8) is provided in the following truth table.

| | | | | | b | | | | |
|---|---|---|---|---|---|---|---|---|---|
| | m8 | 0 | 1 | 2 | 3 | 4 | 5 | 6 | 7 |
| | 0 | 0 | 0 | 0 | 0 | 0 | 0 | 0 | 0 |
| | 1 | 0 | 1 | 2 | 3 | 4 | 5 | 6 | 7 |
| a | 2 | 0 | 2 | 3 | 4 | 5 | 6 | 7 | 1 |
| | 3 | 0 | 3 | 4 | 5 | 6 | 7 | 1 | 2 |
| | 4 | 0 | 4 | 5 | 6 | 7 | 1 | 2 | 3 |
| | 5 | 0 | 5 | 6 | 7 | 1 | 2 | 3 | 4 |
| | 6 | 0 | 6 | 7 | 1 | 2 | 3 | 4 | 5 |
| | 7 | 0 | 7 | 1 | 2 | 3 | 4 | 5 | 6 |

The advantage of the multiplier that the inverse of a multiplication (which one may call a division) is easy to establish. The inverse of multiplier 1 is itself. The inverse of multiplication by 2 is multiplication by 7; the inverse of multiplication by 3 is multiplication by 6; the inverse of multiplication by 4 is multiplication by 5.

Figure 3:
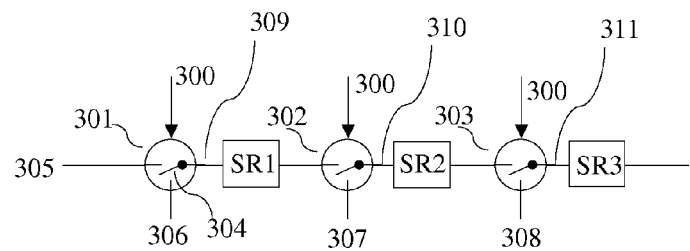
FIG. 3 is a diagram of an LFSR in accordance with an aspect of the present invention.

FIG. 3 shows how one may speed up the coding process by initializing the elements of the shift register with the correct content. FIG. 3 shows as an illustrative example shift register elements SR1, SR2 and SR3. Element SR1 has a switch 301 at its input 309, SR2 has switch 302 at input 310 and SR3 has switch 303 at its input 311. Switch 301 has a first input 305 and a second input 306. The switch is controlled by a signal on control input 300. Depending on the signal on the control input a switch arm 304 connects input 309 of SR1 either with input 305, which may receive either a feedback signal or a signal from another shift register element, or to external input 306 which may provide the initial input for the shift register element. The same setup exists for switches 302 and 303. Accordingly a setup as illustrated by FIG. 3 allows for rapid initialization of the shift register, instead of shifting the initial content into the LFSR, which may be time consuming in (p,k) codes with many symbols.

As an illustrative example of using FIG. 2 two adjacent errors e1 e2 will be resolved occurring in 8-valued codeword [b5 b4 b3 b2 b1 a6 a5 a4 a3 a2 a1]. The two consecutive states of the shift register are shown in FIG. 2. These states are [a6 a5 a4 a3 a2 a1] and [b1 a6 a5 a4 a3 a2]. The other states can easily be determined by deriving the expressions that describe those states and shift all contents one position to the right. At any state the functions will generate intermediate results t1, t2, t3 and t4. The result t4 will be outputted and inputted into the shift register.

The equations for the second state are:

$$t1=2a4+3a2$$

$$t2=5a3+t1$$

$$t3=a2+t2$$

$$t4=a1+t3$$

$$t4=b2$$

The function '+' over GF(8) fp is self reversing. Further more a+a=0.

Accordingly:

$$3a2=2a4+t1$$

$$t1=5a3+t2$$

$$t2=a2+t3$$

$$t3=a1+t4$$

$$t4=b2$$

Thus for instance: $3a2=2a4+5a3+a2+a1+b2$ and: $a2=6(2a4+5a3+a2+a1+b2)$ or $$a2=7a4+3a3+6a2+6a1+6b2.$$

From the first state one can derive:

$$t1=2a2+3a1$$

$$t2=5a4+t1$$

$$t3=a3+t2$$

$$t4=a2+t3$$

$$t4=b1, \text{thus:}$$

$$3a1=2a2+5a4+a3+a2+b1; \text{this will lead to}$$

$$a1=7a2+3a4+6a3+6a2+6b1.$$

As an illustrative example one can use for correction a received 8-valued codeword [b5 b4 b3 b2 b1 a1 a2 a3 a4 a5 a6]=[3 5 1 2 6 2 1 2 3 4 5] which is known to be generated by an 8-valued coder as in FIG. 2. One should first determine if an error has occurred by running the coder for information symbols word [2 1 2 3 4 5]. The codeword generated here with is [0 4 4 0 7 2 1 2 3 4 5]. This codeword only has 6 symbols in common with the received codeword, so clearly at least one error has occurred in the information symbols [a6 a5 a4 a3 a2 a1]. There are two possibilities (under adjacent errors requirements). Either the error(s) occurred in [a5 a4 a3 a2 a1] or it occurred in [b1 a6 a5]. It was already established that the error did not exclusively occur in [b5 b4 b3 b2 b1].

Assuming that symbols in [b5 b4 b3 b2 b1 a6] were error free, one can determine the expressions:

$$a5=3^{-1}(b5+b3+b2+5b1+2a6) \text{ or } a5=6b5+6b3+6b2+3b1+7a6;$$

$$a4=3^{-1}(b4+b2+b1+5a6+2a5) \text{ or } a4=6b4+6b3+6b2+3b1+7a6; \text{ etc}$$

This will generate codeword [3 5 1 2 6 2 4 7 1 7 3], which has 6 symbols in common in corresponding positions with the received codeword, and thus cannot be the correct codeword.

One can also calculate [a5 a4 a3 a2 a1] based on the assumption that [b1 a6 a5] may be in error. From $b2=a6+a5+5a4+2a3+3a2$ and $b3=b1+a6+5a5+2a4+3a3$ one can determine $b2+b3=b1+6a5+3a4+5a3+3a2$. Further more $b1=a5+a4+5a3+2a2+3a1$. Substituting b1 in the expression for b2+b3 will provide $a5=4b2+4b3+3a4+a2+6a1$ and thus a5=1. Using a5=1 in the expression for b1 will generate b1=7. Using a5=1 in the expression for b2 will generate a6=0. Substituting $b1=b2+b3+6a5+3a4+5a3+3a2$ which will generate b1=7. One then can generate a calculated codeword from calculated information word [0 1 2 3 4 5]. This is [3 5 1 2 7 0 1 2 3 4 5]. The calculated codeword has 9 symbols in common in corresponding positions with received codeword [3 5 1 2 6 2 1 2 3 4 5]. Thus the calculated codeword is the correct codeword and [0 1 2 3 4 5] is the correct 8-valued information word.

These procedures can easily be implemented in a processor or a series of processors so that each procedure can be executed in parallel. A processor may also be customized circuitry that executes the methods of the present invention. Based on the assumptions each assumed symbol in error may be determined by executing an n-valued expression using known or assumed to be correct symbols as input.

The example shows that the method provided as an aspect of the present invention works for 8-valued (p,k) codeword. It is easy to see that it works for any n-valued (p,k) code. It also shows that one can correct the word in error if other symbols were in error. Only 6 correct symbols are required to reconstruct the received codeword. However it is not possible to check if the correct codeword was reconstructed correctly if more than 2 symbols in the example were in error. If it is known that a symbol is in error then clearly no check is required. That is why more erasures than unknown errors can be corrected.

It should be clear that one can apply the here presented method to any (p,k) error correcting code wherein (p−k) n-valued symbols are created by a reversible expression. Each codeword has at most k symbols in common with any other codeword in corresponding positions. The distance between codewords is at least (p−k). RS-codes have a distance between codewords of at least (p−k+1). It will be shown in a next section that errors in RS-codes can also be solved using methods of the present invention.

One may create a codeword in Fibonacci configuration or in Galois configuration. In Fibonacci configuration one initializes the LFSR with the information word and then runs the LFSR for (p−k) clock cycles including initialization.

Figure 4:
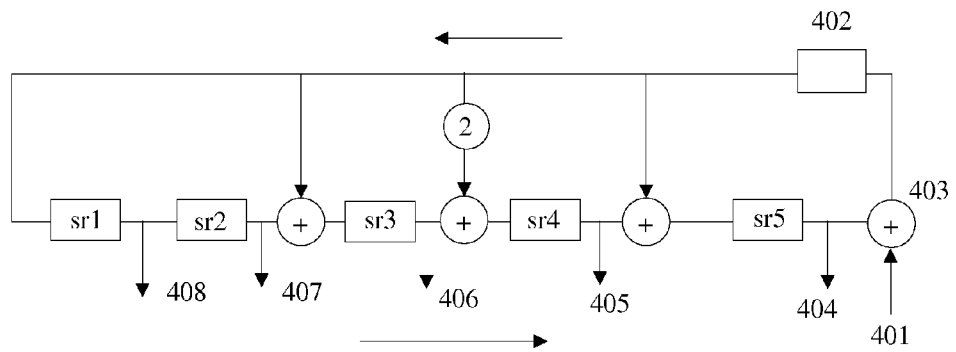
FIG. 4 is a diagram illustrating a coder for an error correcting (p,k) code.

As an aspect of the present invention n-valued (p,k) coders are provided in Galois configuration. An 8-valued illustrative (11,6) example is provided in diagram in FIG. 4. This coder will apply 6 8-valued information symbols and generate 5 check symbols.

The LFSR elements are initialized with values 0 in elements sr1, sr2, sr3, sr4 and sr5. An enabling clock signal is assumed though not shown. The LFSR is inputted with 6 information symbols on input 401 on 8-valued function 403, which is assumed to be an 8-valued adder over GF(8). All functions in the LFSR are adders over GF(8). The tap to the adder connected to element sr3 has a multiplier 2 over GF(8). A gate 402 becomes non-conducting after the 6 information symbols have been inputted. In the literature absence of signal represents 0 and thus all the taps receive a signal 0 under that assumption. The check symbols are then shifted out from the shift register on output 404. First of all this requires additional clock cycles. Further more the functions in other coders may not be adders over GF(8) but generate a state not equal to a state of a first input if a second input has a state 0. The out-shifting then changes the check symbols. An alternative way to capture the check symbols is outputting them on outputs 408, 407, 406, 405 and 404 of the individual shift register elements.

After the LFSR has been inputted with [a1 a2 a3 a4 a5 a6] the content of the shift register is [sr1 sr2 sr3 sr4 sr5] determined by the following expressions.

$sr1 = 7a1 + 6a2 + 4a4 + a5 + a6$ $sr2 = 6a1 + 4a3 + a4 + a5$ $sr3 = 7a1 + 3a2 + a3 + 2a4 + a5 + a6$ $sr4 = 7a1 + 3a2 + 2a3 + 6a4 + 4a5 + 2a6$ $sr5 = a1 + 7a2 + 6a3 + 4a5 + a6$

A codeword generated with this (RS-like) coder is: [sr1 sr2 sr3 sr4 sr5 a1 a2 a3 a4 a5 a6]. For instance the 8-valued word [a1 a2 a3 a4 a5 a6]=[0 1 2 3 4 5] as input to the coder of FIG. 4 will generate codeword [7 1 0 4 4 0 1 2 3 4 5]. The codeword is represented as [sr1 sr2 sr3 sr4 sr5 a1 a2 a3 a4 a5 a6]. One can take again the same approach for solving errors by making assumptions on where errors may have occurred and solve the errors by using the expressions with the errors as variables and the assumed to be error free symbols as constants. The first assumption is that a maximum of two errors can occur and that the errors are adjacent. The last assumption is again made to keep the number of possibilities low in the example. However errors can be anywhere in the word.

For instance assume that either [sr5 a1] or [a1 a2] were in error. That means that [sr1 sr2 sr3 sr4] and [a3 a4 a5 a6] are assumed to be error free. One may determine a1 from sr2=6a1+4a3+a4+a5. The 6a1=sr2+4a3+a4+a5; or a1=$6^{-1}$(sr2+4a3+a4+a5); or a1=3(sr2+4a3+a4+a5); or a1=3sr2+6a3+3a4+3a5; or a1=3*1+6*2+3*3+3*4→a1=3+7+5+6=0. Which is of course correct. One can easily solve the other unknown: 'a2'. One can then generate a calculated codeword using the calculated 'a1' and 'a2' and the 'known' values [a3 a4 a5] and compare the calculated codeword with the received codeword. If the codewords have at least 9 symbols in corresponding positions in common the calculated codeword is the correct codeword.

Applying the Adapted Cramer's Rule

Finding expressions by substitutions may sometimes be cumbersome. However having the expressions is actually beneficial as they can be executed in n-valued logic. They can also be executed in binary form. It is an aspect of the present invention to solve the equations by applying Cramer's rule. One should keep in mind for calculating a determinant that in GF($2^m$) addition is the same as subtraction. Also in 8-valued logic the multiplication over GF(8) has to be applied. However for the rest one can apply Cramer's rule as is well known.

For instance assume that two adjacent errors can occur. The relevant situations are then: [sr5 a1] are in error; or two consecutive symbols in [a2 a3 a4 a5 a6] are in error. Errors occurring only in check symbols may be considered irrelevant. This can be detected by generating a calculated codeword from the received information symbols and comparing the calculated codeword with the received codeword. If the calculated and received codeword have at least (p−2) symbols in common in corresponding positions then any errors occurred in the check symbols and further calculations are not required.

By applying Cramer's rule one may first solve [a2 a3 a4 a5 a6] from a set of equations, rather than evaluating individual assumptions. If potentially [a2 a3 a4 a5 a6] are in error then [sr5 sr4 sr3 sr2 sr1 a1] are not in error. The above equations can then be re-written as:

$6a2+0+4a4+a5+a6=sr1+7a1$ $0+4a3+a4+a5+0=sr2+6a1$ $3a2+a3+2a4+a5+a6=sr3+7a1$ $3a2+2a3+6a4+4a5+2a6=sr4+7a1$ $7a2+6a3+0+4a5+a6=sr5+a1$

The Determinant of the set of equations is:

$$D = \begin{vmatrix} 6 & 0 & 4 & 1 & 1 \\ 0 & 4 & 1 & 1 & 0 \\ 3 & 1 & 2 & 1 & 1 \\ 3 & 2 & 6 & 4 & 2 \\ 7 & 6 & 0 & 4 & 1 \end{vmatrix} = 1$$

The column for solving equations is provided by the terms to the right of the equal sign and provides:

$$d = \begin{vmatrix} sr1+7a1 \\ sr2+6a1 \\ sr3+7a1 \\ sr4+7a1 \\ sr5+a1 \end{vmatrix} = \begin{vmatrix} d1 \\ d2 \\ d3 \\ d4 \\ d5 \end{vmatrix}$$

Assume that using an 8-valued Galois coder determined by the earlier provided equations generates an 11 symbol codeword that is received as: [7 1 0 4 4 1 0 2 3 4 5]. It is assumed that only adjacent errors occur. One can generate a calculated codeword using information word [1 0 2 3 4 5] with the coder thus creating codeword [6 5 1 2 6 1 0 2 3 4 5]. The calculated codeword has 6 symbols in common in corresponding positions with the received codeword and thus there are errors in the information symbols. In accordance with the assumption one should then solve [a2 a3 a4 a5 a6] and [sr5 a1 a2] and check which solution is correct.

For solving [a2 a3 a4 a5 a6] the following expressions can be executed:

$$a2 = \frac{\begin{vmatrix} d1 & 0 & 4 & 1 & 1 \\ d2 & 4 & 1 & 1 & 0 \\ d3 & 1 & 2 & 1 & 1 \\ d4 & 2 & 6 & 4 & 2 \\ d5 & 6 & 0 & 4 & 1 \end{vmatrix}}{D}$$

$$a3 = \frac{\begin{vmatrix} 6 & d1 & 4 & 1 & 1 \\ 0 & d2 & 1 & 1 & 0 \\ 3 & d3 & 2 & 1 & 1 \\ 3 & d4 & 6 & 4 & 2 \\ 7 & d5 & 0 & 4 & 1 \end{vmatrix}}{D}$$

$$a4 = \frac{\begin{vmatrix} 6 & 0 & d1 & 1 & 1 \\ 0 & 4 & d2 & 1 & 0 \\ 3 & 1 & d3 & 1 & 1 \\ 3 & 2 & d4 & 4 & 2 \\ 7 & 6 & d5 & 4 & 1 \end{vmatrix}}{D}$$

$$a5 = \frac{\begin{vmatrix} 6 & 0 & 4 & d1 & 1 \\ 0 & 4 & 1 & d2 & 0 \\ 3 & 1 & 2 & d3 & 1 \\ 3 & 2 & 6 & d4 & 2 \\ 7 & 6 & 0 & d5 & 1 \end{vmatrix}}{D}$$

$$a6 = \frac{\begin{vmatrix} 6 & 0 & 4 & 1 & d1 \\ 0 & 4 & 1 & 1 & d2 \\ 3 & 1 & 2 & 1 & d3 \\ 3 & 2 & 6 & 4 & d4 \\ 7 & 6 & 0 & 4 & d5 \end{vmatrix}}{D}$$

In the above one can check that:

$$d = \begin{vmatrix} sr1 + 7a1 \\ sr2 + 6a1 \\ sr3 + 7a1 \\ sr4 + 7a1 \\ sr5 + a1 \end{vmatrix} = \begin{vmatrix} d1 \\ d2 \\ d3 \\ d4 \\ d5 \end{vmatrix} = \begin{vmatrix} 0 \\ 5 \\ 7 \\ 5 \\ 2 \end{vmatrix}$$

Executing Cramer's rule then provides [a2 a3 a4 a5 a6]=[0 0 7 4 6]. Together with the known value of a1 one then has [a1 a2 a3 a4 a5 a6]=[1 0 0 7 4 6]. This will generate the calculated codeword [7 1 0 4 4 1 0 0 7 4 6]. The calculated codeword has 8 symbols in common with the received codeword and thus can not be the correct codeword.

This means that one should calculate [sr5 a1 a2] based on [sr1 sr2 sr3 sr4 a3 a4 a5 a6]. It is easiest to create a set of 5 equations with 5 unknowns. One can solve [sr5 a1 a2 a3 a4] by the following set of equations:

$7a1+6a2+0+4a4=a5+a6+sr1$ $6a1+0+4a3+a4+0=a5+sr2$ $7a1+3a2+a3+2a4+0=a5+a6+sr3$ $7a1+3a2+2a3+6a4+0=4a5+2a6+sr4$ $a1+7a2+6a3+0+sr5=4a5+a6$

In this set of equations the determinant D is $$D = \begin{vmatrix} 7 & 6 & 0 & 4 & 0 \\ 6 & 0 & 4 & 1 & 0 \\ 7 & 3 & 1 & 2 & 0 \\ 7 & 3 & 2 & 6 & 0 \\ 1 & 7 & 6 & 0 & 1 \end{vmatrix} = 1.$$

For solving [a1 a2 a3 a4 sr5] the following expressions can be executed:

$$a1 = \frac{\begin{vmatrix} d1 & 6 & 0 & 4 & 0 \\ d2 & 0 & 4 & 1 & 0 \\ d3 & 3 & 1 & 2 & 0 \\ d4 & 3 & 2 & 6 & 0 \\ d5 & 7 & 6 & 0 & 1 \end{vmatrix}}{D}$$

$$a2 = \frac{\begin{vmatrix} 7 & d1 & 0 & 4 & 0 \\ 6 & d2 & 4 & 1 & 0 \\ 7 & d3 & 1 & 2 & 0 \\ 7 & d4 & 2 & 6 & 0 \\ 1 & d5 & 6 & 0 & 1 \end{vmatrix}}{D}$$

$$a3 = \frac{\begin{vmatrix} 7 & 6 & d1 & 4 & 0 \\ 6 & 0 & d2 & 1 & 0 \\ 7 & 3 & d3 & 2 & 0 \\ 7 & 3 & d4 & 6 & 0 \\ 1 & 7 & d5 & 0 & 1 \end{vmatrix}}{D}$$

$$a4 = \frac{\begin{vmatrix} 7 & 6 & 0 & d1 & 0 \\ 6 & 0 & 4 & d2 & 0 \\ 7 & 3 & 1 & d3 & 0 \\ 7 & 3 & 2 & d4 & 0 \\ 1 & 7 & 6 & d5 & 1 \end{vmatrix}}{D}$$

$$sr5 = \frac{\begin{vmatrix} 7 & 6 & 0 & 4 & d1 \\ 6 & 0 & 4 & 1 & d2 \\ 7 & 3 & 1 & 2 & d3 \\ 7 & 3 & 2 & 6 & d4 \\ 1 & 7 & 6 & 0 & d5 \end{vmatrix}}{D}$$

In the above one can check that:

$$d = \begin{vmatrix} sr1+a6+a6 \\ sr2+a5 \\ sr3+a5+a6 \\ sr4+4a5+2a6 \\ 4a5+a6 \end{vmatrix} = \begin{vmatrix} d1 \\ d2 \\ d3 \\ d4 \\ d5 \end{vmatrix} = \begin{vmatrix} 0 \\ 2 \\ 7 \\ 1 \\ 4 \end{vmatrix}$$

Executing Cramer's rule will then provide: [a1 a2 a3]=[0 1 2] so [a1 a2 a3 a4 a5]=[0 1 2 3 4 5] which will generate the calculated codeword [sr1 sr2 sr3 sr4 a1 a2 a3 a4 a5 a6]=[7 1 0 4 4 0 1 2 3 4 5] which has 9 symbols in corresponding positions in common with the received codeword and thus [0 1 2 3 4 5] is the correct 8-valued information word.

Solving Errors When Error Locations are Known

As another aspect of the present invention a method will be provided that determines a correct value for a symbol when it is known that the received symbol was in error. These symbols may be erasures, where the incorrectness was for instance already determined by the demodulator or they may be error positions determined by an error location polynomial. The method described previously combines finding one or more symbols in error and correcting the errors. In Reed Solomon error correcting RS(p,k) codes the process of error correcting may have the following steps: establish that a codeword has an error, establish that at least one information symbol is in error, find the location of the errors, determine the magnitude of the error and determine the correct value of a symbol by adjusting a symbol in error with the magnitude of the error.

Once the location of the t errors is known it is easy to apply part of the earlier methods to find the correct value of a symbol. One can do this in at least two ways. First of all if it is known which of the symbols are in error then these symbols are made the unknowns in the determining expressions for the (p,k) coder. These expressions are of course a set of (p−k) independent equations with (p−k) unknowns. Because t<(p−k) one can solve the equations for t unknowns. One may take (p−k)−t known correct symbols as unknowns for padding the set. Though one can also take an appropriate set of t equations with t unknowns and solve the set. This can be done by using Cramer's rule, or by creating solving expressions as done earlier.

For instance in the example of received 8-valued codeword: [7 1 0 4 4 1 0 2 3 4 5] by some mechanism (for instance with additional check symbols) it was determined that a1=1 and a2=0 are in error. One can directly solve a1 and a2 by applying Cramer's rule as shown before with:

$$a1 = \frac{\begin{vmatrix} d1 & 6 & 0 & 4 & 0 \\ d2 & 0 & 4 & 1 & 0 \\ d3 & 3 & 1 & 2 & 0 \\ d4 & 3 & 2 & 6 & 0 \\ d5 & 7 & 6 & 0 & 1 \end{vmatrix}}{D}, \quad a2 = \frac{\begin{vmatrix} 7 & d1 & 0 & 4 & 0 \\ 6 & d2 & 4 & 1 & 0 \\ 7 & d3 & 1 & 2 & 0 \\ 7 & d4 & 2 & 6 & 0 \\ 1 & d5 & 6 & 0 & 1 \end{vmatrix}}{D}$$

and $$d = \begin{vmatrix} sr1+a6+a6 \\ sr2+a5 \\ sr3+a5+a6 \\ sr4+4a5+2a6 \\ 4a5+a6 \end{vmatrix} = \begin{vmatrix} d1 \\ d2 \\ d3 \\ d4 \\ d5 \end{vmatrix} = \begin{vmatrix} 0 \\ 2 \\ 7 \\ 1 \\ 4 \end{vmatrix}$$

$$D = \begin{vmatrix} 7 & 6 & 0 & 4 & 0 \\ 6 & 0 & 4 & 1 & 0 \\ 7 & 3 & 1 & 2 & 0 \\ 7 & 3 & 2 & 6 & 0 \\ 1 & 7 & 6 & 0 & 1 \end{vmatrix}$$

or by implementing an expression that determines a1 and a2. It should be clear that in case of two errors one can make the determinant smaller (2×2). This approach circumvents the use of for instance Forney's algorithm in RS code error correction, which requires to first find an error magnitude and correct a symbol in error with that magnitude.

For the (11,6) code one may have a received codeword [b1 b2 e1 b4 b5 e2 e3 e4 a4 a5 e5] wherein symbols in the position of e1, e2, e3, e4 and e5 (for whatever reason) are known to be in error. One can then solve with Cramer's rule all errors. A (p,k) code may have (p−k) independent equations that may be solved and (p−k) known symbols in error can be solved. As long as positions of errors are known it does not matter if errors are adjacent. One may limit solving errors to information symbols. Applying this method which is an aspect of the present invention allows for direct determination of the correct value symbols, rather then first determining an error magnitude as in Forney's algorithm.

Reed Solomon Codes

The methods and apparatus herein provided for (p,k) codes also work for Reed-Solomon (RS) codes. The RS codes have the advantage that each (p,k) RS codeword of the code has at most (k−1) symbols in common in corresponding positions with any other codeword from the code. This implies that one check symbol less is required for correcting the same number of errors as in the previously provided (p,k) codes. A disadvantage of the RS code with the code provided earlier is that with using n-valued symbols an RS (p,k) code for error correcting t errors requires that n>p. In a RS-code the relation p−k=2*t applies.

One disadvantage of the RS-code in Galois configuration is that RS codewords are created individually: they can not be created by letting the coder run from an initial stage, representing the information symbols. In an RS-coder in Galois configuration one has to start with a shift register with content of all 0s. As disclosed earlier if one has very cheap or fast means for analyzing a very long sequence, one can use a (p,k) codeword as generated according to the earlier disclosed method using an LFSR code generator and test if the received codeword has a certain number of symbols in common with a tested portion of the sequence. If such comparison generates a minimum number then one has detected and corrected the codeword.

There is ample known literature available that describes the generation of RS-code. One book is: Error Control Coding by Shu Lin and Daniel Costello, second edition, Prentice Hall, 2004. The conditions for an (p,k) RS-codeword over GF(q) to be able to correct t errors are:

$p=q-1$;

overhead $p-k=2*t$;

$k=q-1-2t$;

In many cases the variable q is created from m bits so that GF(q)=GF($2^m$). In that case the Galois Field is called an extension or as it will be called herein an extended binary Galois Field. The extended field allows creating for instance an GF(8) wherein each 8-valued symbol can be expressed as a binary word of 3 bits.

RS (p,k) codewords, meeting earlier cited conditions can be created by a method using an LFSR in Galois configuration. In that case the LFSR has (p–k) elements, with initial content of the shift register being all 0s. The k information symbols are shifted into the LFSR for k clock pulses, thus filling the (p–k) shift register elements with a new content. The RS codeword is the combination of k information symbols with (p–k) symbols of the final state of the shift register. Because in practical applications k>>(p–k) one tends to prefer the Galois configuration. The taps and multipliers for a Galois RS coder are selected by using a generator polynomial using consecutive roots of the GF($2^m$) field.

Less known, but equally workable is the Fibonacci LFSR configuration for the RS coder. In that case the coder has an LFSR of k elements. The initial value of the shift register is formed by the k data symbols. By running the LFSR for p clock cycles the complete information word is entered and the remaining (p–k) symbols for the RS codeword are generated as the output of the LFSR.

The Fibonacci configuration has an advantage over the Galois configuration, provided that multipliers and adders are fast compared to the shifting process. A Galois LFSR in an RS coder may run for p clock cycles to produce the (p–k) check symbols. First it requires providing k information symbols to the LFSR. Usually this is done by shifting the information symbols into the shift register. This is followed by shifting out the check symbols out of the register of a Galois LFSR. The coding with a Fibonacci LFSR may take just (p–k) clock cycles, using the configuration of FIG. 3. It should be noted that all LFSRs work under a clock signal. Such a clock signal is assumed in all the drawings and descriptions though not always shown or identified.

Figure 5:
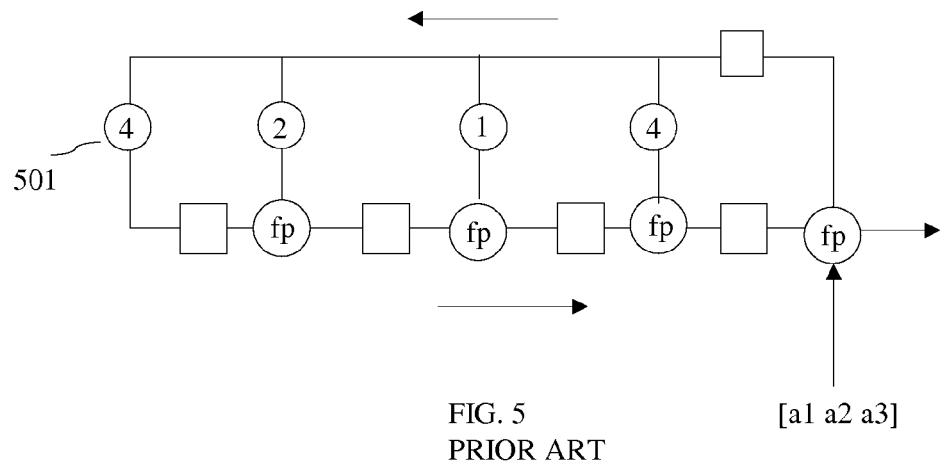
FIG. 5 is another diagram illustrating a coder for an error correcting (p,k) code.

The (7,3) RS coder in Galois configuration in FIG. 5 shows as an illustrative example the LFSR with multiplier and adder functions. The adder fp is an 8-valued adder over GF($2^3$) as provided in an article by Bernard Sklar, entitled Reed-Solomon Codes and available on-line at http://www.informit.com/content/images/art_sklar7_reed-solomon/elementLinks/art_sklar7_reed-solomon.pdf. The multipliers are also defined over GF($2^3$). The truth table of fp and the multiplier are provided in the following truth tables. A multiplier as shown for instance in FIG. 5 at 501 (multiplier 4) is defined as the row (using origin 0) in the multiplier truth table 'mul' e.i.: [0 4 5 6 7 1 2 3].

| c | | | | | b | | | | |
|---|---|---|---|---|---|---|---|---|---|
| | fp | 0 | 1 | 2 | 3 | 4 | 5 | 6 | 7 |
| | 0 | 0 | 1 | 2 | 3 | 4 | 5 | 6 | 7 |
| | 1 | 1 | 0 | 4 | 7 | 2 | 6 | 5 | 3 |
| a | 2 | 2 | 4 | 0 | 5 | 1 | 3 | 7 | 6 |
| | 3 | 3 | 7 | 5 | 0 | 6 | 2 | 4 | 1 |
| | 4 | 4 | 2 | 1 | 6 | 0 | 7 | 3 | 5 |
| | 5 | 5 | 6 | 3 | 2 | 7 | 0 | 1 | 4 |
| | 6 | 6 | 5 | 7 | 4 | 3 | 1 | 0 | 2 |
| | 7 | 7 | 3 | 6 | 1 | 5 | 4 | 2 | 0 |

| c | | | | | b | | | | |
|---|---|---|---|---|---|---|---|---|---|
| | mul | 0 | 1 | 2 | 3 | 4 | 5 | 6 | 7 |
| | 0 | 0 | 0 | 0 | 0 | 0 | 0 | 0 | 0 |
| | 1 | 0 | 1 | 2 | 3 | 4 | 5 | 6 | 7 |
| a | 2 | 0 | 2 | 3 | 4 | 5 | 6 | 7 | 1 |
| | 3 | 0 | 3 | 4 | 5 | 6 | 7 | 1 | 2 |
| | 4 | 0 | 4 | 5 | 6 | 7 | 1 | 2 | 3 |
| | 5 | 0 | 5 | 6 | 7 | 1 | 2 | 3 | 4 |
| | 6 | 0 | 6 | 7 | 1 | 2 | 3 | 4 | 5 |
| | 7 | 0 | 7 | 1 | 2 | 3 | 4 | 5 | 6 |

Figure 6:
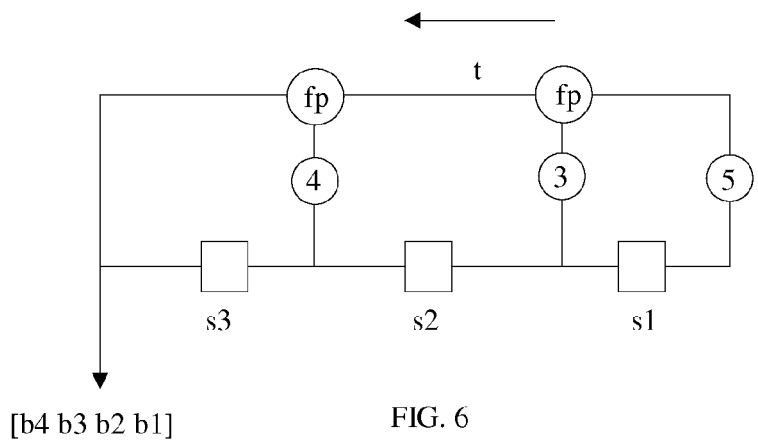
FIG. 6 is a diagram illustrating a coder for an error correcting (p,k) code in Fibonacci configuration.

The same 8-valued adding function fp and multiplier 'mul' are used in the (7,3) RS-coder in the Fibonacci configuration in FIG. 6.

Figure 7:
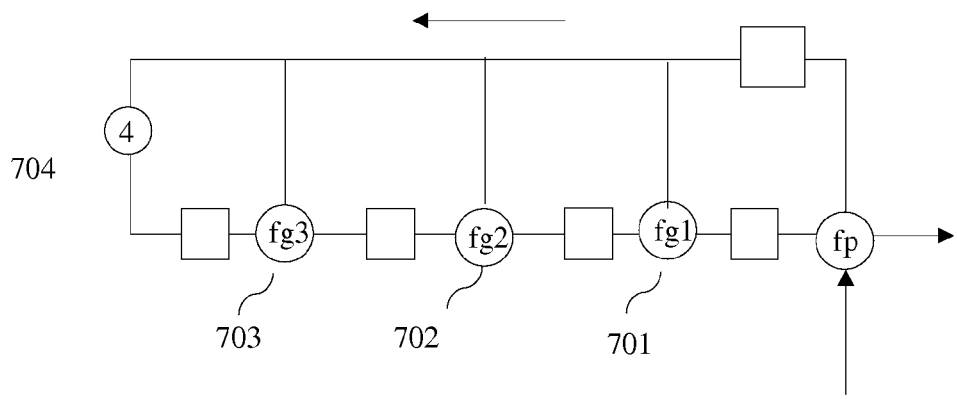
FIG. 7 is another diagram illustrating a coder for an error correcting (p,k) code in accordance with an aspect of the present invention.
Figure 8:
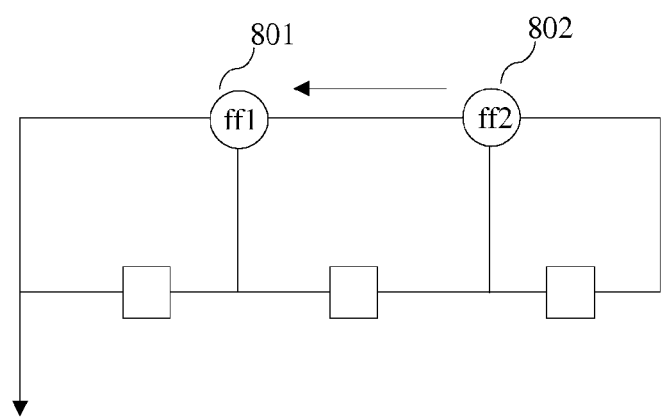
FIG. 8 is another diagram illustrating a coder for an error correcting (p,k) code in accordance with an aspect of the present invention.

As was shown by the inventor in an earlier invention as described in U.S. Non-Provisional patent application Ser. No. 10/935,960, filed Sep. 8, 2004 entitled: TERNARY AND MULTI-VALUE DIGITAL SIGNAL SCRAMBLERS, DESCRAMBLERS AND SEQUENCE GENERATORS, and which is incorporated herein by reference in its entirety, it is possible to combine an n-valued logic function with n-valued multipliers or inverters into a single n-valued logic function. When the function and multipliers or inverters are reversible then the combined function is also reversible. Accordingly the Galois configuration as shown in FIG. 5 can be replaced by the Galois configuration as shown in FIG. 7, wherein combinations of adders and multipliers are replaced by reversible 8-valued functions fg1 in 701, fg2 in 702 and fg3 in 703 and a multiplier 4 in 704. The Fibonacci configuration as shown in FIG. 6 can be replaced by a Fibonacci configuration as shown in FIG. 8 with reversible functions ff1 in 801 and ff2 in 802.

Error Correction in RS Codes by Symbol Reconstruction

An illustrative example applies an 8-valued Reed Solomon (7,3) code.

Error correction by symbol reconstruction based on error assumption works the same in RS-codes as in the earlier described non-optimal (p,k) codes. One may assume in the illustrative case of a (7,3) RS-code that at max 2 symbols in a codeword in a certain position are in error. For simplicity it is again assumed that 2 adjacent symbols are in error, but the method works as well for non-adjacent errors, and errors may occur in any order of course. If particular symbols are assumed to be in error in the illustrative example, then clearly one also may assume that the other symbols are not in error. Accordingly one can calculate the supposedly "in error" symbols from the supposedly "error-free" symbols. A reconstructed codeword then has at most 2 symbols in difference in corresponding positions with the original codeword. Based on the characteristics of the coding method one can not construct more than one valid codeword that has only 2 or less symbols in difference with the original codeword with errors. If it turns out that the original codeword had no errors then all symbols of the reconstructed and the original codeword are in common.

"Symbols in common" between a calculated codeword and a received codeword such as a RS codeword is intended to mean herein symbols in common in like or corresponding positions. For instance the codewords [0 1 2 3 4 5] and [5 4 3 2 1 0] have 6 symbols in common, but have no symbols in corresponding positions in common.

It is of course possible in the above example that not the assumed 2 symbols but 2 different code symbols were in error. Based on the assumption and according to the characteristics of the code one will then have created a codeword on that assumption that has a difference of more than 2 symbols in corresponding positions with the original codeword and thus should be rejected as being an incorrect solution.

Accordingly one has to check for only those errors that matter. For instance in a (7,3) RS code there are 3 information symbols that determine the 4 remainder symbols. Assuming that the errors occur in the remainder and not in the information symbol one can just take the three information symbols and recalculate the remainder. The newly recalculated codeword can then at maximum only have a two symbol difference with the original codeword based on the possibility of 2 errors. If that is the case then the calculated codeword is the error-free codeword.

One can apply the method of error correction by reconstructing of symbols. In a (7,3) RS-code there are 3 information symbols and 4 overhead symbols. The properties of the RS-code are such that each 7 symbol word in that code only has 2 symbols in common in like or corresponding positions with each other codeword.

In order to perform error correction a set of equations has to be solved. As shown in the earlier it is assumed for ease of formula manipulation that potential errors that occur are adjacent to each other. That condition is not required for the method here provided as one aspect of the present invention to work, however it makes the process easier to follow for illustrative purposes. The assumption then is that 2 errors will have occurred in two adjacent symbols of the 7 symbol codeword and that 5 symbols are correct. Based on the assumed to be correct symbols one can calculate the assumed to be in error symbols. Accordingly one has then calculated an assumed to be correct 7 symbol codeword. One then determines how many symbols in the calculated word and in the "in error" codeword in like positions are in common. If calculated and received overhead symbols (or remainder symbols) are identical, then no errors have occurred. If at least 5 symbols in the original (7,3) codeword and the calculated (7,3) codeword are in common in like positions, then the calculated codeword is the correct codeword and the 3 information symbols in the calculated codeword are the error free information symbols.

As before one can provide the equations for creating the check symbols [b1 b2 b3 b4] from information symbols [x1 x2 x3]. The Fibonacci coder of FIG. 6 and the Galois coder of FIG. 5 are equivalent and the determining equations for the check symbols are of course the same. However the shift register states of both the coders usually are different. One should also take care of the order of symbols when comparing the coders. In the Galois coder the shift register starts as [0 0 0] in the classical case (though this is not really required and one may also select a different initial state) and the information symbols are inputted in order x1, x2 and x3. The end state of the Galois shift register is [b1 b2 b3 b4]. In the Fibonacci configuration the shift register is initiated as [x3 x2 x1] and the check symbols are outputted as [b1 b2 b3 b4]. The end state of the Fibonacci shift register is of course [b3 b2 b1]. The equations for determining a codeword [b1 b2 b3 b4 x1 x2 x3] from information symbols [x1 x2 x3] are:

$b1=6x1+7x2+4x3$ $b2=5x1+6x2+2x3$ $b3=x1+x2+x3$ $b4=5x1+3x2+4x3$

This shows that it is not really required to use an LFSR. The check symbols may also be generated by circuitry that performs the above expressions. This is important in situations wherein LFSRs are too slow or too power consuming. It should be noted that the '+' function is provided by fp and the * or multiplication by 'mul' in the illustrative example. Due to the fact that addition with 0 does not affect the result and multiplication by 0 is 0 one can actually apply Galois arithmetic to these equations. One can also combine addition with the multipliers and create single functions that are reversible.

Once one knows what the information symbols [x1 x2 x3] are, one can calculate the overhead symbols [b1 b2 b3 b4] from the expressions, without actually running an LFSR. LFSRs sometimes can form a bottleneck. It is not even required to calculate the check symbols. If one so desires one can actually store the relevant codewords in a memory and use the information symbols for example as a memory address. This applies to actually all LFSR generated symbols or words and not only to the (7,3) code which is used as an illustrative example The aspect of avoiding LFSRs may become especially urgent in long RS(p,k) codewords. For instance the C1 RS(32, 28) codeword as applied in music CDs requires entering 28 symbols into a 4 element LFSR. Determining a next state of an LFSR element requires usually a multiplication and at least an addition. It was shown by the inventor for instance in earlier cited patent application Ser. No. 10/935,960 how functions involving an inverter or multiplier at an input can be simplified. Accordingly one may simplify the expressions that describe generating check symbols. In the RS (32,28) code each check symbol may be expressed by an equation involving 28 variables (the information symbols), wherein each variable may involve being multiplied by a constant. One may execute groups of the equations in parallel, enabling the calculation of the check symbols in 5 steps, rather than 28 plus 4 for outshifting the symbols from the LFSR. It will be shown later that the calculations may take place in binary form. It is of course required that the symbols are available for input.

It was shown by the inventor in U.S. patent application Ser. No. 11/696,261 filed Apr. 4, 2007 entitled 'Binary And N-Valued LFSR And LFCSR Based Scramblers, Descramblers, Sequence Generators And Detectors In Galois Configuration', which is incorporated herein by reference, that further significant reduction of time requirements can be achieved by re-designing an expression as a multi-input circuit. This time reduction by using a multi-input approach in generating RS and (p,k) code check symbols is another aspect of the present invention. Because a limited variety of inverters is required the multi-input approach can be time as well as resource efficient.

The earlier check symbol equations for the RS(7,3) code were generated by using Galois Field Arithmetic. The rules for applying the functions were shown earlier. The principles are the same for extended Galois Fields and can be extended to any GF(q) or GF($2^m$). Some operations, such as an addition being self reversing and adding identical symbols always providing 0 only applies in extended binary GFs.

In order to determine the correct symbols in a RS (p,k) code one may again make assumptions about symbols in error, determine a calculated codeword and see if the calculated and received codeword differ only in a number of assumed symbols in error. If so then the calculated codeword is correct. If not then the calculated codeword is not correct and one should make different assumptions.

One approach is to solve the equations for the Fibonacci and Galois configuration by using Cramer's rule adapted for GF(8) in this case or GF(q) for q-valued codes.

The rules for arithmetic in GF($2^3$) use the definition of 'fp' for addition and 'mul' for multiplication as shown in the respective truth tables. The GF rules that can be derived from the truth tables which have been stated earlier. The reverse for the multipliers is: $1^{-1}=1$; $2^{-1}=7$; $3^{-1}=6$; $4^{-1}=5$; $5^{-1}=4$; $6^{-1}=3$; $7^{-1}=2$ The function + is equivalent with fp and * with mul.

Cramer's rule allows for solving p independent equations with p unknowns. For the illustrative RS(7,3) code there are 4 independent equations. However the assumption is that there are only 2 errors. This offers the opportunity to solve a maximum number of equations, combining several assumptions, rather than solving a series of 2 equations. Assume that a maximum of two adjacent errors can occur in codeword [b1 b2 b3 b4 x1 x2 x3]. Then the relevant assumption for solving errors in information symbols is: [b4 x1 x2 x3] is in error, addressing situation [b4 x1], or [x1 x2] or [x2 x3] is in error. One should rewrite the check symbol generating equations as:

$$6x1+7x2+4x3+0b4=b1$$

$$5x1+7x2+2x3+0b4=b2$$

$$x1+x2+x3+0b4=b3$$

$$5x1+3x2+4x3+b4=0$$

The determinant of the above equations is $$D = \begin{vmatrix} 6 & 7 & 4 & 0 \\ 5 & 7 & 2 & 0 \\ 1 & 1 & 1 & 0 \\ 5 & 3 & 4 & 1 \end{vmatrix} = 3.$$

The column for solving the equation is $$d = \begin{vmatrix} b1 \\ b2 \\ b3 \\ 0 \end{vmatrix}.$$

According to Cramer's rule adapted for GF(8) the solutions of the equations are:

$$x1 = \frac{\begin{vmatrix} b1 & 7 & 4 & 0 \\ b2 & 7 & 2 & 0 \\ b3 & 1 & 1 & 0 \\ 0 & 3 & 4 & 1 \end{vmatrix}}{D} = \frac{\begin{vmatrix} b1 & 7 & 4 & 0 \\ b2 & 7 & 2 & 0 \\ b3 & 1 & 1 & 0 \\ 0 & 3 & 4 & 1 \end{vmatrix}}{3}$$

which is identical to $$x1 = \begin{vmatrix} b1 & 7 & 4 & 0 \\ b2 & 7 & 2 & 0 \\ b3 & 1 & 1 & 0 \\ 0 & 3 & 4 & 1 \end{vmatrix} * 6 \text{ as } 3^{-1} = 6.$$

$$x2 = \begin{vmatrix} 6 & b1 & 4 & 0 \\ 5 & b2 & 2 & 0 \\ 1 & b3 & 1 & 0 \\ 5 & 0 & 4 & 1 \end{vmatrix} * 6$$

$$x3 = \begin{vmatrix} 6 & 7 & b1 & 0 \\ 5 & 7 & b2 & 0 \\ 1 & 1 & b3 & 0 \\ 5 & 3 & 0 & 1 \end{vmatrix} * 6,$$

and $$b4 = \begin{vmatrix} 6 & 7 & 4 & b1 \\ 5 & 7 & 2 & b2 \\ 1 & 1 & 1 & b3 \\ 5 & 3 & 4 & 0 \end{vmatrix} * 6$$

As an example one take the codeword [1 6 7 4 1 4 6] and calculate the values from [x1 x2 x3] and b4. For Cramer's rule the solution vector $$d = \begin{vmatrix} b1 \\ b2 \\ b3 \\ 0 \end{vmatrix} = \begin{vmatrix} 1 \\ 6 \\ 7 \\ 0 \end{vmatrix}.$$

One can check that applying Cramer's rule will generate again [x1 x2 x3 b4]=[1 4 6 4]. This shows how one can easily reconstruct the error symbols when it is known which symbols are in error in a RS (p,k) code. One can thus calculate the correct value of a symbol directly from known or assumed to be correct symbols. It is not required, as for instance in Forney's algorithm to first determine the magnitude of the error and add the error magnitude to the symbol in error to obtain the correct value.

In general one can try different assumptions, create a calculated codeword which is compared with a received codeword. If the symbols in common between those codewords exceed a certain number than the calculated codeword is correct. Clearly such a method of estimation is doable for an RS(p,k) code that has a sufficient number of check symbols and wherein errors may assume to be adjacent or within a certain distance. If errors can happen anywhere the number of assumptions may become not practical. In those cases one may consider applying known methods of error location such as finding the roots of an error location polynomial.

Adjacent errors are determined by how symbols are arranged in the codeword. If a different arrangement is made than the solutions have to be adjusted accordingly.

Another example according to one aspect of the present invention of reconstructing the symbols in an (7,3) RS-code with errors using error assumptions and applying the GF arithmetic rules on the Fibonacci equation set will be provided next.

It is assumed that the errors occurred in b1 and a3 and the codeword is [b4 b3 b2 e1 e2 a2 a1]. Earlier the equation was determined for calculating b4 in Fibonacci configuration (not having errors) by b4=5b1+3b2+4b3. In this case b1 is in error. One can then calculate b1 from:

$$5b1 = b4 + 3b2 + 4b3$$

to $$b1 = 5^{-1} * b4 + 5^{-1} * 3 * b2 + 5^{-1} * 4 * b3$$
$$= 4 * b4 + 4 * 3 * b2 + 4 * 4 * b3$$
$$= 4b4 + 6b2 + 7b3$$

One can exhaustively test the above expression. One example would be to use the 8-valued word [a1 a2 a3]=[0 6 7]. One may use either the Galois configuration of FIG. 5 with initial shift register all 0 or the Fibonacci configuration of FIG. 6 with initial shift register [a3 a2 a1]=[7 6 0] to create the RS(7,3) codeword [a1 a2 a3 b1 b2 b3 b4]=[0 6 7 7 2 6 2]. Substituting the values of [b2 b3 b4] in the equation b1=4b4+ 6b2+7b3 will generate the calculated value b1=7.

The next step (as a3 was assumed also to be in error) is to calculate a3 from symbols in the RS(7,3) codeword which are assumed to be correct. For example one can use: b3=5a3+ 3b1+4b2 to solve a3. However one can only execute this expression after b1 was calculated. If it is required to calculate b1 and a3 in parallel one may use the earlier equation for calculation of b1. For the illustrative example it may be assumed that b1 is first calculated. This can then be followed by: 5*a3=b3+4*b2+3*b1 (working under + is fp and * is mul) and a3=$5^{-1}$*b3+$5^{-1}$*4*b2+$5^{-1}$*3*b1=4*b3+4*4*b2+ 4*3*b1=4b3+7b2+6b1. Using Galois arithmetic this will generate a3=7.

After calculating b1 and a3 one then should compare the calculated codeword with the original codeword with errors. If in comparing the calculated and original codewords have at least 5 symbols in like positions in common, the calculated codeword is the correct codeword and [a1 a2 a3] wherein a3 was reconstructed is then the correct set of information symbols.

One may repeat this approach when a3 and a2 or a2 and a1 are in error. However when one may assume that [b1 b2 b3 b4] was error free one can directly calculate [a3 a2 a1] as was shown before.

One can thus create different apparatus that implement an expression, such as a3=4b3+7b2+6b1 which will calculate or reconstruct symbols based on inputted symbols to be error free. One can then determine if a calculated word can be the correct codeword by comparing it to the received codeword. One can directly execute the appropriate expression when the positions of errors were determined separately.

Erasures are here also considered to be errors. It should be clear that methods here provided can correct a number of errors or erasures in a codeword that is equal to the number of check symbols when one can determine positions of errors and erasures.

Error Location

The here provided method of error location by assuming symbols in error, calculating a corrected word and determining the number of symbols in common in like positions between a received and a calculated corrected word is fast and can be executed in parallel for all assumptions. Traditionally the process of error correction in RS codes as provided for instance in the earlier cited book of Lin and Costello on page 242-252 and may comprise the following steps:
1. Compute the syndromes
2. Determine the error-location polynomial
3. Determine the error-value
4. Evaluate the error-location and error-value
5. Correct the errors As an aspect of the present invention the step is added to determine if errors have only occurred in check symbols, which may be considered irrelevant errors.

A similar approach is also explained in the earlier cited article of Bernard Sklar and should be familiar to one of ordinary skill in the art. The fundamental background of the ability to solve errors is that the error corrupted codeword polynomial is a combination of the uncorrupted codeword polynomial and the error polynomial. The uncorrupted codeword polynomial is 0 for substituting the roots of a generator polynomial. One can find the syndromes by substituting the roots of the generator polynomial in the codeword polynomial. From the syndromes one can create the error location polynomial. By finding the roots of the error polynomial one has identified the location of the errors. Related approaches depending on syndrome calculations and error location polynomials exist of which an example is the well known Berlekamp-Massey algorithm.

If one is looking for a maximum number of errors it may actually be attractive to determine all relevant assumptions, calculate the related error calculated words and determine a valid error corrected word, instead of calculating all syndromes.

Another advantage is that location and corrected errors are determined at the same time in the methods here provided.

In general the process of error correction in a (p,k) codeword comprises: finding the error followed by correcting the error. In the method that is an aspect of the present invention one makes an assumption on the errors, corrects the assumed errors and then checks if the errors were correctly assumed. One may say that one first corrects the errors and then locates them.

Binary Processing in GF($2^m$)

One familiar with Galois Field arithmetic knows that elements of GF(8) may be found by using a primitive polynomial. The 8-valued truth table is in essence based on the relationship between elements and not necessarily how the elements are represented in binary form. As an illustrative example the truth table as well as the binary method over GF(8) will be used to solve relationships between information symbols and overhead check symbols in a codeword. These methods apply to any field GF($2^{\wedge}$m).

First, one would like to create the elements in Finite Field GF(8). The method can be found in any textbook dealing with BCH and RS codes and error correcting decoding. The examples herein will be used from the article by Dr. Bernard Sklar entitled Reed-Solomon Codes and available on-line at http://www.informit.com//content/images/art_sklar7_reed-solomon/elementLinks/art_sklar7_reed-solomon.pdf.

It is explained in the article how one can generate the elements of for instance GF($2^3$) by taking the generating LFSR of for instance primitive polynomial $1+X+X^3$ and generate all states for the LFSR by using an initial state of for instance [1 0 0]. Such an LFSR in Galois configuration is shown in FIG. 9. The state [0 0 0] of this LFSR is the forbidden state. Starting with [1 0 0] the consecutive states of the shift register are:
[1 0 0]
[0 1 0]
[0 0 1]
[1 1 0]
[0 1 1]
[1 1 1]
[1 0 1]

The 8 different elements of GF(8) are then: [0 0 0]=0; [1 0 0]=1; [0 1 0]=2; [0 0 1]=3; [1 1 0]=4; [0 1 1]=5; [1 1 1]=6; and [1 0 1]=7. The relationship between the 8-valued element as provided in the adder over GF(8) will hold. However, as is known, one may determine also the relationships in the adder by executing the modulo-2 addition on the individual bits of an element of GF(8). For instance the example of 3 fp 5→2 can also be determined by executing [0 0 1]≠[0 1 1] on individual bits in corresponding positions which will provide [0 1 0] which corresponds with symbol 2 in GF(8). One can check this against the 8-valued addition over GF(8) of which the truth table is provided in FIG. 10 using $\alpha^1$=[1 0 0] as the base element of GF(8).

Multiplication in binary form is in essence using the LFSR of FIG. 9. It may be helpful to show the truth table of the multiplier over GF(8) in the form as presented in the cited article of Dr. Sklar. The truth table of the multiplier is shown in FIG. 11. One can see that multiplying $\alpha^i$ with $\alpha^k$ is established by adding the exponents to form $\alpha^{(i+k) \bmod 7}$. One may also say that multiplying by $\alpha^k$ is multiplying by $\alpha^{1+1+1\ldots 1}$ or multiplying by $\alpha^1 \cdot \alpha^1 \cdot \alpha^1 \ldots \alpha^1$. Multiplying by $\alpha^1$ if one checks with the truth table of FIG. 11 is moving to the next element in GF(8). So multiplying by $\alpha^2$ is then moving up 2 elements in GF(8). Accordingly one may conclude that multiplying an element x of GF(8) by $\alpha^1$ is having the shift register in initial state x and running the LFSR for one clock cycle. Multiplying x by $\alpha^2$ is then initializing the shift register of FIG. 9 with x and running the LFSR for two clock cycles, etc.

Figure 12:
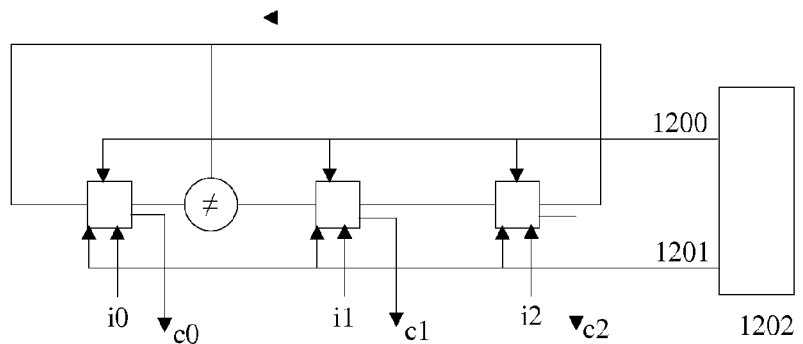
FIG. 12 is a diagram of an LFSR based multiplier in GF(8).

Accordingly one has now a binary way to execute for instance an 8-valued expression $\alpha^3 xx + \alpha^5 xy$ over GF(8), wherein also x and y are elements of GF(8). A multiplier in binary form in GF(8) is shown in FIG. 12. The multiplier is an LFSR which will be provide the content of the shift register [c0 c1 c2] on individual outputs of the binary shift register elements on occurrence of enabling signal provided on 1200. At the occurrence of an enabling signal (assumed to be also on 1200 in this case) the new content [i0 i1 i2] of the shift register elements available at individual inputs will be read into the individual elements. A control unit 1202 determines for how many clock pulses the LFSR will run and will generate the clock pulses on 1201. After the required number of clock pulses on 1201 an enabling signal on 1200 will be provided and the result [c0 c1 c2] will be made available on the individual outputs of the shift register, thus completing the multiplication over GF(8) in binary form. Both the results of for instance $\alpha^3 xx$ and $\alpha^5 xy$ can thus be made available in binary form and are of course elements over GF(8) which can be added over GF(8) by taking the XOR of the corresponding bits representing both elements over GF(8). Accordingly an 8-valued expression over GF(8) involving multiplication and addition over GF(8) can be executed completely in binary form.

Multiplying is thus reduced to executing an LFSR for a number of clock cycles. One may actually reverse the direction of running the LFSR. For instance multiplying by $\alpha^5$ which is running the LFSR in a forward direction for 5 clock cycles is identical to run the LFSR in reverse for two cycles.

The following table shows the expressions for the content of the first shift register element SR1, the second element SR2 and the third element SR3 starting from [x1 x2 x3], when the LFSR is operated as shown in FIG. 9 which will be called the forward direction. From the diagram of FIG. 9 it should be clear that the new input of SR1 is the output of SR3. The first input to the XOR function also provides the content of SR3. The second input to the XOR function provides the content of SR1. The output of the XOR function is then y→SR3≠SR1. This binary value y will be shifted into SR2 at the clock pulse; the content of SR2 will be shifted into SR3 and the content of SR3 will be shifted into SR1 at the clock pulse.

| forward | SR1 | SR2 | SR3 |
|---|---|---|---|
| t = 0 | x1 | x2 | x3 |
| t = 1 | x3 | x1 ≠ x3 | x2 |
| t = 2 | x2 | x2 ≠ x3 | x1 ≠ x3 |
| t = 3 | x1 ≠ x3 | x1 ≠ x2 ≠ x3 | x2 ≠ x3 |
| t = 4 | x2 ≠ x3 | x1 ≠ x2 | x1 ≠ x2 ≠ x3 |
| t = 5 | x1 ≠ x2 ≠ x3 | x1 | x1 ≠ x2 |
| t = 6 | x1 ≠ x2 | x3 | x1 |
| t = 7 | x1 | x2 | x3 |

One can see that at t=7 the initial content of [SR1 SR2 SR3] again re-appears and the whole cycle starts over again.

One may operate the LFSR also in reverse direction. Herein input and output as in FIG. 9 are switched in position. Again the initial state of the shift register elements [SR1 SR2 SR3] is [x1 x2 x3]. However now SR3 assumes the value of SR1 after a clock pulse. The output generates SR1≠SR2 which will be stored in SR1 and the element SR2 assumes the value of SR3. The state table of the LFSR in reverse is provided in the following table.

| reverse | SR1 | SR2 | SR3 |
|---|---|---|---|
| t = 0 | x1 | x2 | x3 |
| t = −1 | x1 ≠ x2 | x3 | x1 |
| t = −2 | x1 ≠ x2 ≠ x3 | x1 | x1 ≠ x2 |
| t = −3 | x2 ≠ x3 | x1 ≠ x2 | x1 ≠ x2 ≠ x3 |
| t = −4 | x1 ≠ x3 | x1 ≠ x2 ≠ x3 | x2 ≠ x3 |
| t = −5 | x2 | x2 ≠ x3 | x1 ≠ x3 |
| t = −6 | x3 | x1 ≠ x3 | x2 |
| t = −7 | x1 | x2 | x3 |

The 'forward' and 'reverse' tables are mirror images, as was to be expected.

One can avoid the LFSR for performing multiplication by executing the expressions describing the LFSR content, rather than the LFSR itself.

At this stage the addition as well the multiplication with a constant over $GF(2^m)$ have been shown to be able to be realized in binary form. The following step is now to determine expressions over $GF(2^m)$ that will solve errors assumed to be in error in a binary way. As an example a (7,3) RS code over GF(8) will again be used.

The standard method of solving errors in RS codes is well known and documented. One is referred to for instance the cited article of Dr. Sklar for an elaborate explanation. Basically the steps are: 1. create an RS codeword and transmit the word 2. Receive the word and check if errors have occurred. As a new step as an aspect of the present invention, one may check if an error has occurred in an information symbol 3. determine the syndromes for the roots of the generator polynomial. 4. determine the error polynomial. 5. solve error locations 6. solve error magnitude at the locations 7. correct the errors.

The methods developed by the inventor and described in earlier cited patent application Ser. Nos. 11/739,189 and 11/743,893 and which can be applied to RS and other cyclic codes (p,k) may include the steps:

1. Generate a (p,k) codeword so that each codeword has at least 2*t+1 different symbols in corresponding positions with any other codeword.
2. Receive a (p,k) codeword and check if errors have occurred in information symbols
3. Make an assumption of at most t errors having occurred in the codeword and solve the errors by using n-valued resolving expressions into a calculated codeword
4. Check number of symbols in common in corresponding positions in the codeword and the calculated codeword
5. If the number is for instance greater than (p+k)/2 then the calculated codeword is the error free codeword All steps in the above described method are deterministic. They require the individual solving expressions to be determined and implemented. However this only needs to be done once. Accordingly the performance can be very fast with relatively limited resources. As an aspect of the present invention it will be shown how the n-valued expressions can be executed in binary form.

Figure 13:
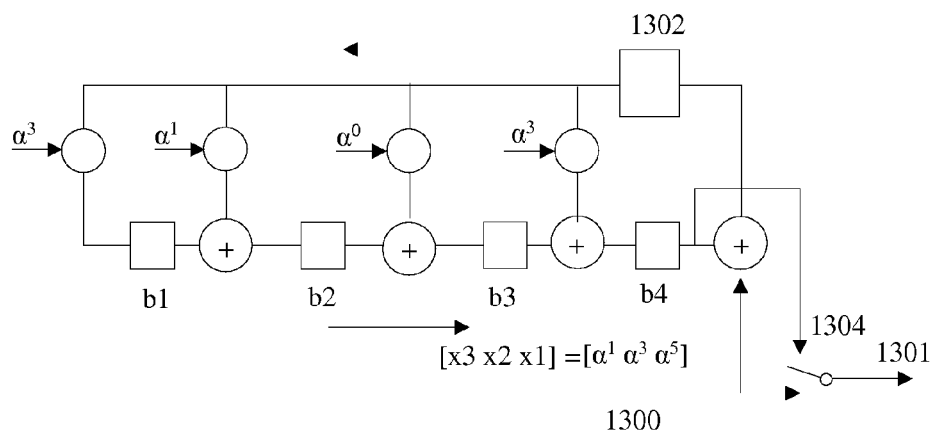
FIG. 13 is a diagram of a Reed Solomon coder.

To demonstrate the methods of binary implementation as a first example the notation and coder of the Sklar article will be used. The coder is provided in FIG. 13. This is equivalent to FIG. 9 on page 20 of the Sklar article. A signal [x3 x2 x1] is provided on input 1300, wherein the signal elements are provided from the right to the left. The initial state of the shift register is [0 0 0 0]. After entering [x3 x2 x1] the content of the shift register is [b1 b2 b3 b4]. The gate 1302 is made non-conducting after three clock cycles thus assumed to provide a symbol 0 and the content of the shift register is shifted out on output 1304 to output 1301 when a switch is set in the right position.

Herein the elements of the extended binary field GF(8) used are $\{0, \alpha^0, \alpha^1, \alpha^2, \alpha^3, \alpha^4, \alpha^5, \alpha^6\}$. The relations between elements of the field are provided by the primitive polynomial $1+X+X^3$ with $1=\alpha^0=[1\ 0\ 0]$. The + operation over GF(8) is defined by the truth table of FIG. 10. The multiplication over GF(8) truth table was provided in FIG. 11. The + operation is self reversing, commutative and associative. The + and × operations are also distributive. The division ÷ or reverse of × is provided in the table of FIG. 14. Of importance are the columns in FIG. 14 which are the inverters of multipliers by a constant. It shows that the inverse of multiplying by $\alpha^0$ is itself; the inverse of multiplying by $\alpha^1$ is multiplying by $\alpha^6$; the inverse of multiplying by $\alpha^2$ is multiplying by $\alpha^5$; the inverse of multiplying by $\alpha^3$ is multiplying by $\alpha^4$; and of course the inverse of multiplying by $\alpha^4$ is multiplying by $\alpha^3$, the inverse of multiplying by $\alpha^5$ is multiplying by $\alpha^2$ and the inverse of multiplying by $\alpha^6$ is multiplying by $\alpha^1$.

An aspect of the present invention is to provide the relationship between [b1 b2 b3 b4] and [x3 x2 x1]. These relations are:

$b1=\alpha^3 x3+\alpha^6 x2+\alpha^5 x1$ $b2=\alpha^1 x3+\alpha^6 x2+\alpha^4 x1$ $b3=\alpha^0 x3+\alpha^0 x2+\alpha^0 x1$ $b4=\alpha^3 x3+\alpha^2 x2+\alpha^4 x1$ One can check by using $[x3\ x2\ x1]=[\alpha^1\ \alpha^3\ \alpha^5]$ one will generate $[b1\ b2\ b3\ b4]=[\alpha^0\ \alpha^2\ \alpha^4\ \alpha^6]$.

This (7,3) RS code can correct up to two errors. Assume for the purpose of the example that x1 and x2 were in error. By using the expressions for b1 and b2 one can determine expressions for x1 and x2.

$b1=\alpha^3 x3+\alpha^6 x2+\alpha^5 x1$ $b2=\alpha^1 x3+\alpha^6 x2+\alpha^4 x1$ $(b1+b2)=(\alpha^1+\alpha^3)x3+(\alpha^6+\alpha^6)x2+(\alpha^4+\alpha^5)x1$, or $(b1+b2)=\alpha^0 x3+\alpha^0 x1$, or $x1=(\alpha^0)^{-1}(b1+b2+\alpha^0 x3)$, or $x1=\alpha^0 b1+\alpha^0 b2+\alpha^0 x3$. Because multiplying by $\alpha^0$ is identity one may also say that: $x1=b1+b2+x3$.

Applying further substitution one will find $x2=\alpha^5 b1+\alpha^6 b2+\alpha^3 x3$. Substituting the known and assumed to be correct values of b1, b2 and x3 one finds that: $x1=\alpha^5$ and $x2=\alpha^3$, which are the correct values.

To show that the binary implementation will provide the same answer x1 will first be determined in its binary form. From using the LFSR it was determined earlier that:
0=[0 0 0];
$\alpha^0$=[1 0 0];
$\alpha^1$=[0 1 0];
$\alpha^2$=[0 0 1];
$\alpha^3$=[1 1 0];
$\alpha^4$=[0 1 1];
$\alpha^5$=[1 1 1];
$\alpha^6$=[1 0 1].

Accordingly $x1=b1+b2+x3$ is $x1=\alpha^0+\alpha^2+\alpha^1$ in addition over GF(8). It is also identical to the XORing of the individual bits in corresponding positions of the binary representation of the elements or:

$x1\to[1\ 0\ 0]\ne[0\ 0\ 1]\ne[0\ 1\ 0]$ which will provide $x1=[1\ 1\ 1]$ which is equivalent to $\alpha^5$.

A similar approach can be applied to calculating x2. One has to evaluate $x2=\alpha^5 b1+\alpha^6 b2+\alpha^3 x3$. This can be achieved by first evaluating $\alpha^5 b1$, $\alpha^6 b2$, and $\alpha^3 x3$, followed by the addition of the individually individual terms. It was established before that multiplying b1 by $\alpha^5$ is identical to running the LFSR for 5 clock pulses with the initial state of the LFSR being b1. Suppose that b1 can be represented in binary form as [a1 a2 a3]. From the earlier developed table of expressions representing multiplications one can see that an LFSR starting with [a1 a2 a3] after 5 clock pulses has the state of the LFSR as [(a1≠a2≠a3) a1 (a1≠a2)].

A similar approach for $\alpha^6 b2$ with b2=[c1 c2 c3] leads to the state of the LFSR after 6 clock pulses as: [(c1≠c2) c3 c1].

And $\alpha^3 x3$ with x3 [d1 d2 d3] has end state [(d1≠d3) (d1≠d2≠d3) (d2≠d3)].

With $b1=\alpha^0=[1\ 0\ 0]$ will generate $\alpha^5 b1 \to [(1\ne 0\ne 0)\ 1\ (1\ne 0)]\to[1\ 1\ 1]$.

With $b2=\alpha^2=[0\ 0\ 1]$ will generate $\alpha^6 b2 \to [(0\ne 0)\ 1\ 0]\to[0\ 1\ 0]$.

With $x3=\alpha^1=[0\ 1\ 0]$ will generate $\alpha^3 x3 \to [(0\ne 0)\ (0\ne 1\ne 0)\ (1\ne 0)]\to[0\ 1\ 1]$.

Taking the XOR of the three words over the individual corresponding bits will provide [1 1 0]. One can check in the table that $\alpha^3=[1\ 1\ 0]$ and thus $x2=\alpha^3$, which is correct.

Accordingly one can solve the equations for assumed symbols to be in error or not to be in error in GF(8) and in fact for any equation in GF($2^m$) by executing binary expressions. It is to be appreciated that in those cases a binary expression also represents an $2^m$-valued expression. So one may also execute those expressions by applying the $2^m$-valued truth tables for addition and multiplication.

FIG. 15 shows an LFSR based generator implementing primitive polynomial $1+X+X4$ which will generate elements of GF(16) as provided in the following table.

| Symbol in GF(16) | Binary form | | | |
|---|---|---|---|---|
| 0 | 0 | 0 | 0 | 0 |
| 1 | 1 | 0 | 0 | 0 |
| 2 | 0 | 1 | 0 | 0 |
| 3 | 0 | 0 | 1 | 0 |
| 4 | 0 | 0 | 0 | 1 |
| 5 | 1 | 1 | 0 | 0 |
| 6 | 0 | 1 | 1 | 0 |
| 7 | 0 | 0 | 1 | 1 |
| 8 | 1 | 1 | 0 | 1 |
| 9 | 1 | 0 | 1 | 0 |
| 10 | 0 | 1 | 0 | 1 |
| 11 | 1 | 1 | 1 | 0 |
| 12 | 0 | 1 | 1 | 1 |
| 13 | 1 | 1 | 1 | 1 |
| 14 | 1 | 0 | 1 | 1 |
| 15 | 1 | 0 | 0 | 1 |

The truth table for addition in GF(16) is provided in the following table.

| GF(16)+ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 1 | 2 | 3 | 4 | 5 | 6 | 7 | 8 | 9 | 10 | 11 | 12 | 13 | 14 | 15 |
| 1 | 1 | 0 | 5 | 9 | 15 | 2 | 11 | 14 | 10 | 3 | 8 | 6 | 13 | 12 | 7 | 4 |
| 2 | 2 | 5 | 0 | 6 | 10 | 1 | 3 | 12 | 15 | 11 | 4 | 9 | 7 | 14 | 13 | 8 |
| 3 | 3 | 9 | 6 | 0 | 7 | 11 | 2 | 4 | 13 | 1 | 12 | 5 | 10 | 8 | 15 | 14 |
| 4 | 4 | 15 | 10 | 7 | 0 | 8 | 12 | 3 | 5 | 14 | 2 | 13 | 6 | 11 | 9 | 1 |
| 5 | 5 | 2 | 1 | 11 | 8 | 0 | 9 | 13 | 4 | 6 | 15 | 3 | 14 | 7 | 12 | 10 |
| 6 | 6 | 11 | 3 | 2 | 12 | 9 | 0 | 10 | 14 | 5 | 7 | 1 | 4 | 15 | 8 | 13 |
| 7 | 7 | 14 | 12 | 4 | 3 | 13 | 10 | 0 | 11 | 15 | 6 | 8 | 2 | 5 | 1 | 9 |
| 8 | 8 | 10 | 15 | 13 | 5 | 4 | 14 | 11 | 0 | 12 | 1 | 7 | 9 | 3 | 6 | 2 |
| 9 | 9 | 3 | 11 | 1 | 14 | 6 | 5 | 15 | 12 | 0 | 13 | 2 | 8 | 10 | 4 | 7 |
| 10 | 10 | 8 | 4 | 12 | 2 | 15 | 7 | 6 | 1 | 13 | 0 | 14 | 3 | 9 | 11 | 5 |
| 11 | 11 | 6 | 9 | 5 | 13 | 3 | 1 | 8 | 7 | 2 | 14 | 0 | 15 | 4 | 10 | 12 |
| 12 | 12 | 13 | 7 | 10 | 6 | 14 | 4 | 2 | 9 | 8 | 3 | 15 | 0 | 1 | 5 | 11 |
| 13 | 13 | 12 | 14 | 8 | 11 | 7 | 15 | 5 | 3 | 10 | 9 | 4 | 1 | 0 | 2 | 6 |
| 14 | 14 | 7 | 13 | 15 | 9 | 12 | 8 | 1 | 6 | 4 | 11 | 10 | 5 | 2 | 0 | 3 |
| 15 | 15 | 4 | 8 | 14 | 1 | 10 | 13 | 9 | 2 | 7 | 5 | 12 | 11 | 6 | 3 | 0 |

The truth table for multiplication over GF(16) is provided in the following table.

| GF(16)× | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | 10 | 11 | 12 | 13 | 14 | 15 |
| 2 | 0 | 2 | 3 | 4 | 5 | 6 | 7 | 8 | 9 | 10 | 11 | 12 | 13 | 14 | 15 | 1 |
| 3 | 0 | 3 | 4 | 5 | 6 | 7 | 8 | 9 | 10 | 11 | 12 | 13 | 14 | 15 | 1 | 2 |
| 4 | 0 | 4 | 5 | 6 | 7 | 8 | 9 | 10 | 11 | 12 | 13 | 14 | 15 | 1 | 2 | 3 |
| 5 | 0 | 5 | 6 | 7 | 8 | 9 | 10 | 11 | 12 | 13 | 14 | 15 | 1 | 2 | 3 | 4 |
| 6 | 0 | 6 | 7 | 8 | 9 | 10 | 11 | 12 | 13 | 14 | 15 | 1 | 2 | 3 | 4 | 5 |
| 7 | 0 | 7 | 8 | 9 | 10 | 11 | 12 | 13 | 14 | 15 | 1 | 2 | 3 | 4 | 5 | 6 |
| 8 | 0 | 8 | 9 | 10 | 11 | 12 | 13 | 14 | 15 | 1 | 2 | 3 | 4 | 5 | 6 | 7 |
| 9 | 0 | 9 | 10 | 11 | 12 | 13 | 14 | 15 | 1 | 2 | 3 | 4 | 5 | 6 | 7 | 8 |
| 10 | 0 | 10 | 11 | 12 | 13 | 14 | 15 | 1 | 2 | 3 | 4 | 5 | 6 | 7 | 8 | 9 |
| 11 | 0 | 11 | 12 | 13 | 14 | 15 | 1 | 2 | 3 | 4 | 5 | 6 | 7 | 8 | 9 | 10 |
| 12 | 0 | 12 | 13 | 14 | 15 | 1 | 2 | 3 | 4 | 5 | 6 | 7 | 8 | 9 | 10 | 11 |
| 13 | 0 | 13 | 14 | 15 | 1 | 2 | 3 | 4 | 5 | 6 | 7 | 8 | 9 | 10 | 11 | 12 |
| 14 | 0 | 14 | 15 | 1 | 2 | 3 | 4 | 5 | 6 | 7 | 8 | 9 | 10 | 11 | 12 | 13 |
| 15 | 0 | 15 | 1 | 2 | 3 | 4 | 5 | 6 | 7 | 8 | 9 | 10 | 11 | 12 | 13 | 14 |

The numbers in the truth tables represent the states as generated by the primitive binary polynomial of degree 4 and which can be generated by the LFSR of FIG. 15.

One can easily check that the addition can be executed in binary fashion by XORing the binary representations of a 16-valued state. For instance 7+14. 7=[0 0 1 1] and 14=[1 0 1 1]. Then [0 0 1 1]≠[1 0 1 1]→[1 0 0 0]. According to the LFSR generator [1 0 0 0]=1. This result is confirmed by the truth table of + over GF(16).

Multiplication with a constant k in GF(16) is like before letting run the LFSR for k clock pulses. Thus the multiplication 7*14 can be performed by using the state table of GF(16). One may start at 7 and move up 13 positions, keeping in mind that staying in the same position is multiplying by 1. When one reaches the end of the table one should continue at state 1 of the table, skipping state 0 as this is a forbidden state in the LFSR. Doing that from 7 and moving up 13 positions will reach state 5. Doing the same from 14 and moving up 6 positions will again reach 5.

One can perform multiplication of an 16-valued symbol x represented in binary form by x=[x1 x2 x3 x4] by a constant a=[a1 a2 a3 a4] in binary form wherein both 'x' and 'a' are 16-valued elements of GF(16) by running the LFSR of FIG. 15 for 'a−1' clock pulses with initial state of the LFSR being x=[x1 x2 x3 x4]. Accordingly if a=14 one should run the LFSR for 13 clock pulses. One can also replace running the LFSR with executing a binary expression. The expressions for running the LFSR of FIG. 15 for 1 to 15 times are shown in the table below.

| | | | |
|---|---|---|---|
| 1 x1 | x2 | x3 | x4 |
| 2 x4 | x1 ≠ x4 | x2 | x3 |
| 3 x3 | x3 ≠ x4 | x1 ≠ x4 | x2 |
| 4 x2 | x2 ≠ x3 | x3 ≠ x4 | x1 ≠ x4 |
| 5 x1 ≠ x4 | x1 ≠ x2 ≠ x4 | x2 ≠ x3 | x3 ≠ x4 |
| 6 x3 ≠ x4 | x1 ≠ x3 | x1 ≠ x2 ≠ x4 | x2 ≠ x3 |
| 7 x2 ≠ x3 | x2 ≠ x4 | x1 ≠ x3 | x1 ≠ x2 ≠ x4 |
| 8 x1 ≠ x2 ≠ x4 | x1 ≠ x3 ≠ x4 | x2 ≠ x4 | x1 ≠ x3 |
| 9 x1 ≠ x3 | x2 ≠ x3 ≠ x4 | x1 ≠ x3 ≠ x4 | x2 ≠ x4 |
| 10 x2 ≠ x4 | x1 ≠ x2 ≠ x3 ≠ x4 | x2 ≠ x3 ≠ x4 | x1 ≠ x3 ≠ x4 |
| 11 x1 ≠ x3 ≠ x4 | x1 ≠ x2 ≠ x3 | x1 ≠ x2 ≠ x3 ≠ x4 | x2 ≠ x3 ≠ x4 |
| 12 x2 ≠ x3 ≠ x4 | x1 ≠ x2 | x1 ≠ x2 ≠ x3 | x1 ≠ x2 ≠ x3 ≠ x4 |
| 13 x1 ≠ x2 ≠ x3 ≠ x4 | x1 | x1 ≠ x2 | x1 ≠ x2 ≠ x3 |
| 14 x1 ≠ x2 ≠ x3 | x4 | x1 | x1 ≠ x2 |
| 15 x1 ≠ x2 | x3 | x4 | x1 |

The multiplication 7*14 can be determined by x=7=[x1 x2 x3 x4]=[0 0 1 1]. The result for multiplication by 14 from the above table is [(x1≠x2≠x3) x4 x1 (x1≠x2)]=[1 1 0 0]=5, which confirms the approach.

Accordingly one can execute any expression a.x+ b.y+ ... +d.z wherein a, b, d, x, y and z are elements of GF(16) in binary form. It is thus easy to see that also any expression a.x+b.y+ ... +d.z wherein a, b, d, x, y and z are elements of $GF(2^m)$ can be executed by either using truth tables, or binary expressions in binary circuitry or using binary expressions and using LFSRs or any mixture of these components.

A similar approach can be applied to any extended Finite Field $GF(q^m)$ wherein q is a prime number. This allows realizing an expression over $GF(q^m)$ in a q-ary form. Unfortunately some of the properties of binary logic, such as + being self-reversing, and associative may not apply.

In the Sklar article an example is provided where the position of 2 symbols in error are calculated from the roots of an error location polynomial when x1 and b1 are in error. The next step in the known method is to calculate an error value.

It is an aspect of the present invention to calculate the correct symbol directly if it is known which symbols are in error. First of all b1 is a check symbol. One may calculate b1 for further checking purposes. However x1 is an information symbol and is really the critical symbol to solve. One may solve x1 from different equations of b2, b3, b4. Once x1 is solved one may solve b1.

Apply $b2=\alpha^1 x3+\alpha^6 x2+\alpha^4 x1$. This equation can be rewritten as: $\alpha^4 x1=b2+\alpha^1 x3+\alpha^6 x2$ because + is self reversing. The operations are distributive, thus: $x1=(\alpha^4)^{-1}(b2+\alpha^1 x3+\alpha^6 x2)$ or $x1=\alpha^3(b2+\alpha^1 x3+\alpha^6 x2)=\alpha^3 b2+\alpha^3 \alpha^1 x3+\alpha^3 \alpha^6 x2$. By substituting $x2=\alpha^3$, $x3=\alpha^1$ and $b2=\alpha^2$ and using the truth tables for + and × of FIG. 10 and FIG. 11 one finds that $x1=\alpha^5$, which is of course the correct answer.

Slightly more involved is a calculation wherein two of the three information symbols are in error. However one skilled in the art can readily see that solving two equations with 2 unknowns can be easily achieved. One can for instance apply the adapted Cramer's rule.

It should be apparent that Cramer's rule for solving or reconstructing symbols in error in $GF(2^m)$ can be performed in binary form. As an illustrative example assume that one solves errors from 3 equations. Assume that $$D = \begin{vmatrix} a11 & a12 & a13 \\ a21 & a22 & a23 \\ a31 & a32 & a33 \end{vmatrix}$$

D can be calculated as D=a11*(a22*a33+a23*a32)+a21* (a12*a33+a13*a32)+a31*(a12*a23+a13*a22). All elements are constants. All elements of the expression can be calculated in binary form as shown before and D will be an element of $GF(2^m)$. Accordingly $D^{-1}$ will also be an element over $GF(2^m)$.

According to Cramer's rule:

$$x1 = \frac{\begin{vmatrix} d1 & a12 & a13 \\ d2 & a22 & a23 \\ d3 & a32 & a33 \end{vmatrix}}{D}.$$

$$\text{Or } x1 = \begin{vmatrix} d1 & a12 & a13 \\ d2 & a22 & a23 \\ d3 & a32 & a33 \end{vmatrix} * D^{-1}.$$

This leads to x1={d1*(a22*a33+a23*a32)+d2*(a12*a33+ a13*a32)+d3*(a12*a23+a13*a22)}*$D^{-1}$. The structure of the coder determines the constants a12, etc. The only variables depending on symbol values are d1, d2 and d3. Accordingly one can calculate the constants in the expression as c1, c2 and c3 and the expression that has to be executed to determine x1 according to Cramer's rule is then: x1=c1*d1+ c2*d2+c3*d3, which can also be executed in binary form.

Accordingly one can provide the different expressions for calculating symbols in error when it is known which symbols are in error. An illustrative example how to generate the error corrected 3 symbols of a (7,3) error correcting RS code is provided in FIG. 16. Herein 1800 represent the received codeword of 7 symbols of which up to two symbols can be in error. The codeword is first provided to a unit 1801 that can for instance determine an error polynomial. If no error in an information symbol is detected the unit 1801 provides the information symbols [x1 x2 x3] on an output 1807. If errors are detected in an information symbol the unit enables one of a plurality of output lines. Each line signifies a certain combination of errors. Each relevant combination is identified in FIG. 16. For instance the first line is enabled when x1 and b1 are detected in error. The second line is enabled when x1 and not b1 are in error. This situation covers if only x1 is in error or if x1 and for instance b2 are in error. In both situations x1 can be determined from the first equation related to b1. The other combinations are self explanatory. Error location can be done by standard error location methods or by making error assumptions.

An enabled line activates a unit that will execute the proper expressions, using error free symbols, to calculate the information symbol determined to be in error. For instance unit 1804 has as input the received codeword. Line 1803 when active enables 1804 to perform the necessary expressions and provides on an output the error corrected word [x1 x2 x3]. For clarity only the first unit 1804 and the last unit 1806, which is enabled by a line 1805 when x2 and x3 are in error, are shown.

One may for instance use a series of multiplexers controlled by enabling lines to provide on a final output the corrected information symbols [x1 x2 x3].

Figure 16:
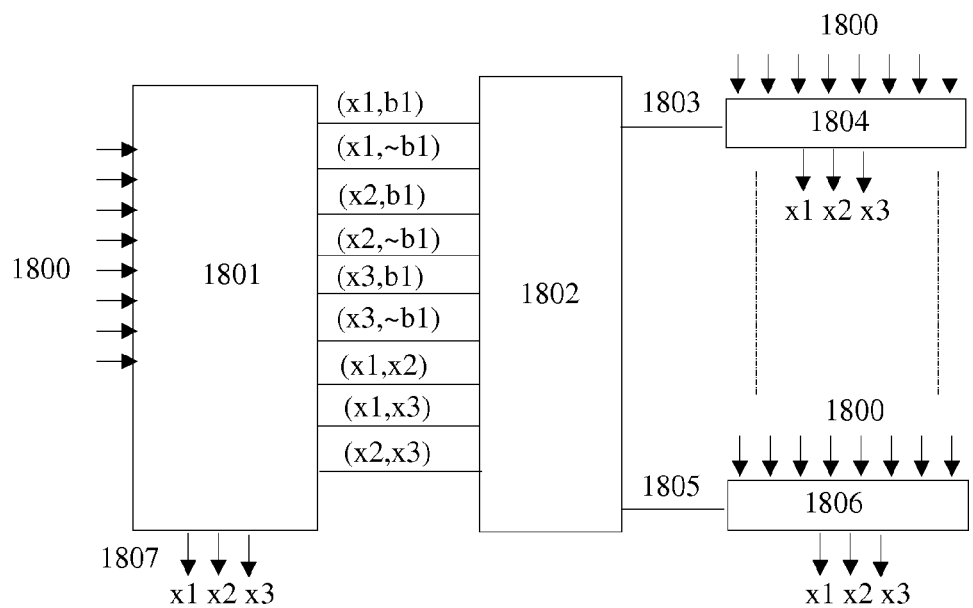
FIG. 16 is a diagram of an error correcting system in accordance with an aspect of the present invention.

One may modify the approach of FIG. 16 in such a way that based on error locations the correct solution by way of Cramer's rule will be generated. For instance based on error locations the correct columns of the determinant may be selected and the solution vector will be calculated and placed in its appropriate place in the determinant and provided for instance to a processor that will execute Cramer's rule.

As one aspect of the present invention one may use existing error locating methods and calculate the corrected error. The methods of error correction can be implemented in general microprocessors or signal processors. The individual steps can also be realized as dedicated switching circuits and programmable circuits such as Programmable Arrays or Look-up Table methods. One may apply dedicated n-valued switching devices. One may also apply binary coded n-valued symbols and apply binary coded n-valued truth tables. One may also execute all steps of error correction with binary circuits. In all situations one may represent an n-valued symbol by binary symbols. In all embodiments a processor is considered to be a circuit that can execute a step or more steps of a method provided as an aspect of the present invention. A program or software that executes a step of a method may be considered herein to be instructions saved and retrievable from a memory. Also a configuration of customized or dedicated circuitry that executes a step of a method may be considered in the context of the present invention as a program or software. Even if such a step is hard wired it may be considered herein to be equivalent to a program or software or an instruction.

Error Location by Up-and-Down State Tracking

One of the time consuming processes in error correction of (p,k) codewords may be locating errors. Known methods such as using error location polynomials are time consuming. Making assumptions (or a brute force) approach has the advantage that each assumption can be executing in parallel with evaluating other assumptions. This can make the process very fast, but also highly resource intensive. One novel method in locating errors in n-valued (p,k) codewords with LFSR based coders is by tracking the state of each shift register element of the coder using the symbols of the received codeword.

Figure 17:
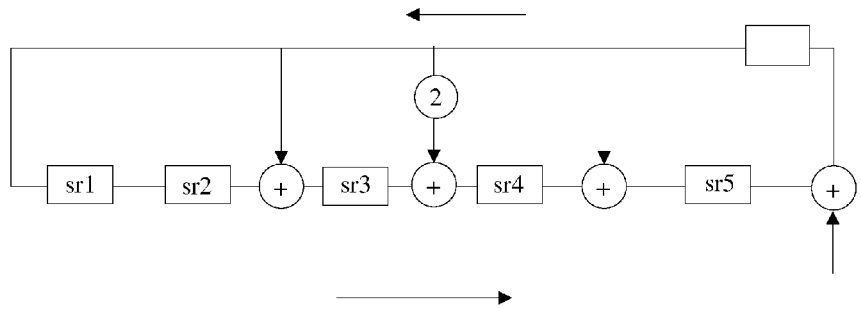
FIG. 17 is a diagram of a (p,k) coder.

Using as an illustrative example the 8-valued (11,6) Galois coder of FIG. 17, keeping in mind that the addition and multiplication are defined in GF(n) or GF(8) in this case and are NOT modulo-n. To generate a (11,6) codeword the LFSR coder is started with initial content [0 0 0 0 0] and six symbols [a1 a2 a3 a3 a5 a6] are entered, resulting in the final state [b1 b2 b3 b4 b5] of the coder, making the codeword [b1 b2 b3 b4 b5 a1 a2 a3 a4 a5 a6]. It is to be understood that the order of symbols in a codeword may be different, as long as the relationship and their order is well defined. For this section the order of the inputted information symbols is first a1, followed by a2, etc. After a6 has been entered the content of the shift register in FIG. 17 from left to right is b1, b2, b3, b4, b5 in [sr1 sr2 sr3 sr4 sr5].

Figure 18:
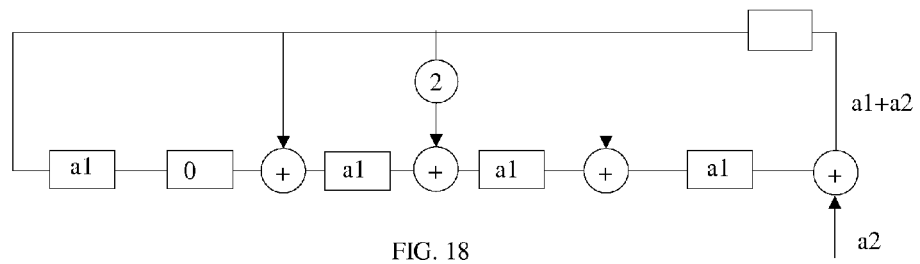
FIG. 18 is another diagram of a (p,k) coder.
Figure 19:
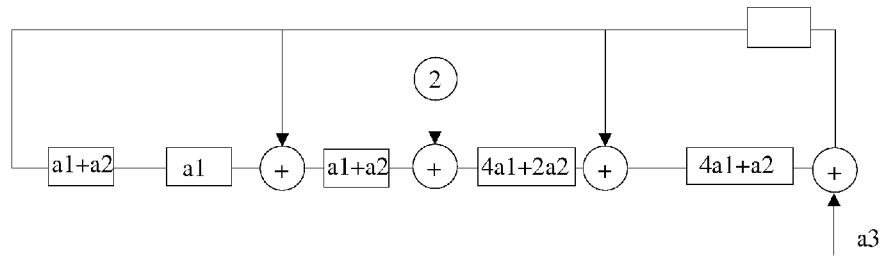
FIG. 19 is yet another diagram of a (p,k) coder.

FIG. 18 shows the coder of FIG. 17 after symbol a1 has been entered with the content of the shift register being [a1 0 a1 a1 a1] and with a2 being entered before the content of the shift register has been shifted. FIG. 19 shows the content of the shift register after being shifted on a2 and with symbol a3 at the input. The content is [(a1+a2) a1 (a1+a2) (4a1+2a2) (4a1+a2)]. One can thus determine or track the states of the shift register after entering a new symbol at the input starting from [0 0 0 0 0] until end state [b1 b2 b3 b4 b5]. This will be called "tracking up" of states.

Figure 20:
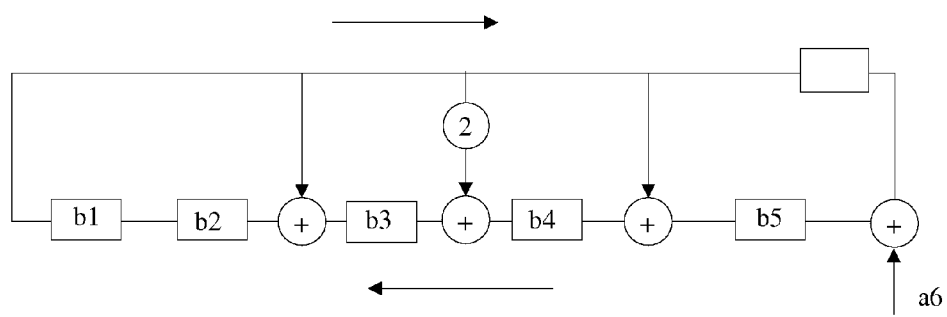
FIG. 20 is a diagram of a (p,k) coder in reverse mode in accordance with an aspect of the present invention.
Figure 21:
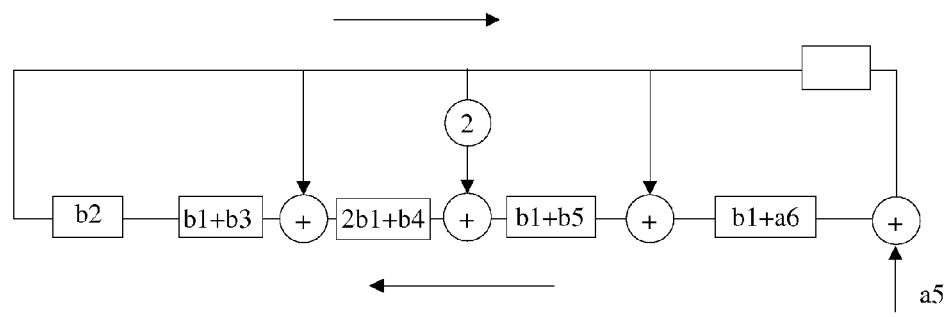
FIG. 21 is another diagram of a (p,k) coder in reverse mode in accordance with an aspect of the present invention.

One can also reverse the process of determining the states of the shift register by starting at [b1 b2 b3 b4 b5] and determining previous states. This will be called "tracking down" of states. FIG. 20 shows a diagram of the coder starting at [b1 b2 b3 b4 b5]. One can determine the previous state by reversing the direction of the shift register. Accordingly all content is shifted from the right to the left. The content of the first element becomes the value that is fed back into the LFSR and that is combined with an inputted information symbol. FIG. 21 shows the content of the reversed shift register after symbol a6 was entered and the register had shifted. The content is then [b2 (b1+b3) (2b1+b4) (b1+b5) (b1+a6)].

FIG. 22 shows all the expressions for calculating the states of the shift register "tracking up". FIG. 23 shows all the expressions for calculating the states "tracking down". The availability of the expressions allows for all states to be determined in parallel. One is reminded of the fact that all expressions are defined in GF(8) and that operations '+' and '*' are in GF(8). So one can determine the states by calculating them from expressions, one can do so serially or in parallel. One can also execute the LFSR up and down and determining states strictly from preceding states, either tracking up or down.

It should be apparent that if no errors had occurred in any of the symbols of the codeword then the states of the tracking up states are identical to the tracking down states in corresponding positions. This creates a range of possibilities to determine where an error has occurred. One way is to compare up and down states directly. Depending on the coder and the number of inputted symbols errors are more or less likely to perpetuate into different up or down states. The selected coder also makes a difference. Because the '+' function will create 0 if two identical numbers are added, a coder with few multiplications may help eliminate some terms, thus reducing the number of variables that a state depends upon. It is possible to create multiple dependent expressions for determining if a symbol was in error. For the coder of FIG. 17 it is possible to directly compare the corresponding up and down states and greatly narrow the possibilities of symbols in error.

The first step in this method is to create the 'up-down state' matrix. This matrix shows for every error combination the common states which are un-affected by errors. For the (11,6) coder there are 51 relevant 2-error combinations to consider. Any combination of errors only in check symbols is excluded as being not relevant and can be detected upfront. Single errors in [a1 a2 a3a a4 a5 a6] and combination errors are considered as specific occurrences. It should be clear that any single error may be combined as part of a double error occurrence. Further more one can solve any double error occurring in 5 adjacent symbols and solve those as a single combination. For illustrative purposes all relevant combinations of 2 errors and all single errors will be considered as individual cases.

One may write all up and down states as a state difference vector. One may further put in the position of a vector a 0 when corresponding states are identical and a 1 when corresponding states are different. One can then create a matrix formed of state difference vectors for specific error combinations. Further more the vectors will be put in descending order of number of 0s in the matrix. One can easily create the vectors by inserting errors in codewords and determining the state difference vectors. A representative state difference matrix is shown in FIG. 24. The next to last column shows the number of zeros in the vector (or row) of the matrix and the last column shows how this vector was caused by which errors. Because different errors will create zeros in identical positions it is recommended to put the vectors with the greatest number of 0s high up in the matrix.

The method of detection is then fairly easy. For instance one receives an 8-valued codeword [7 2 1 6 4 7 7 7 3 7 7]. The state difference vector generated (equal corresponding states determined by running the coder 'up' and 'down' using the symbols of the codeword) is v=[1 1 1 1 0 0 1 1 1 1 1 0 0 1 0 0 1 0 0 1 1 0 1 1 1 1 1 1 1 1 1 1 1 1].

One can determine the errors by finding the appropriate position of the vector in the matrix in FIG. 24. This turns out to be for the error combination a4 b5. One can then apply for instance Cramer's rule to the equation set for solving a4 and b5. This will lead to the error corrected codeword [7 2 1 6 7 7 7 7 7 7 7].

If the same number of 0s is determined for different possible errors one should execute Cramer's rule for all cases with the same number of 0s and compare the calculated codewords, as before with the received codeword. The calculated codeword meeting the error condition for least difference in number of symbols in corresponding positions is the correct codeword.

Steps comprised in one error location process in accordance with one aspect of the present invention are provided in diagram in FIG. 26. FIG. 25 is a diagram showing the initial process of creating a state difference matrix for different error combinations. FIG. 26 shows to determine a state difference vector and determine which row of the matrix matches this vector. The error or error combination corresponding to the row determines how to solve error equations and to determine the correct codeword.

Comparing the intermediate coder states recreated from a known starting state and recreated from a received end state is called: 'up-and-down state tracking'. Patterns of differences or equalities of compared states provide information about location of errors. One can use up-and-down state tracking methods in different ways, using state differences as well as state equalities, which are fully contemplated.

It should be noted that some coder configurations (especially the magnitude of the multipliers) may determine the usefulness of the up-down state tracking method. In general (p,k) coders are created by using a generating polynomial over a finite field wherein the roots of the generating polynomials are consecutive elements of the finite field GF(n). It may be advantageous, to search for an attractive coder configuration for the up-down state tracking method.

In summary methods for error correction of (p,k) codes have been disclosed. The (p,k) codes may be Reed Solomon codes. (p,k) Coders may be in LFSR form either in Galois or Fibonacci configuration. Check symbols in a (p,k) code may also be determined by executing n-valued expressions without using LFSRs. N-valued expressions may be executed in binary form. Errors may be solved by executing an n-valued expression or by executing Cramer's rule. Errors and erasures can be solved directly without first determining an error magnitude when error positions are known. Error locations can be identified by applying error location polynomials. Error locations can also be identified by applying 'up and down state tracking'.

N-valued circuits can be implemented in different ways. The inventor has provided methods and apparatus to implement an n-valued truth table by using switches and inverters in U.S. Pat. No. 7,218,144 issued on May 15, 2007 which is incorporated herein by reference.

The methods of error correction of (p,k) codes provided herein can be easily implemented in general microprocessors or signal processors. The individual steps can also be realized as dedicated switching circuits such as Programmable Arrays, FPGA or Look-up Table methods. One may also apply dedicated n-valued switching devices or binary devices. One may also apply binary coded or represented n-valued symbols and apply binary coded n-valued truth tables. It has also been demonstrated how one may use binary functions to execute the methods for error correction. Error correction methods using Cramer's rule have also been provided.

There is a very wide field of application in error correcting coding, and especially in binary coded n-valued symbols. Aspects of the present invention can be applied in these areas, such as wireless and wired communication and in areas such as storage of data such as optical disks. In an embodiment of a system the methods and system of error correction can be used in a communication system with a transmitter and a receiver. The system can be a wired communication system, using electrical, optical or any other electromagnetic signal. The system can also be wireless, generating and receiving radio, infrared, laser or any other electromagnetic signal that is not guided by a wire, a fiber or any other waveguide. The system can be a cell-phone system, a wireless computer network, WiFi, WiMax or any other wireless or wired system. The system can also be applied for RFID or barcode applications. Further more a system using the methods or system with aspects of the present invention can also be a storage system, including for storing and retrieving or playing of data, music, voice, video or any other multi-media data. The methods herein disclosed can be embedded in a chip as part of a system, used as a set of instructions on a processor, stored for execution in a dedicated chip or circuit, or provided as a set of individual chips or any other form that allows implementations of the methods and the creation of a system.

Accordingly one may have a unit, which can be: a) a set of instructions for processing symbols on a processor, a memory for the instructions and a processor for execution the instructions; b) a circuit that can execute a set of instructions on data symbols, wherein the instructions are hardwired in a datapath with processing components such as logic functions; c) a combination of hardwired components in a datapath and stored instructions which can be retrieved from a memory; d) any circuit that can process symbols in accordance with the methods here provided. One may have different units such as for instance: a coding unit, a decoding unit, an LFSR unit, a unit that checks if errors exclusively occur in check symbols, an error location unit, a unit that checks the number of symbols that two codewords have in common, a unit that executes an expression to calculate a symbol value, a Cramer's rule unit, an error location unit, an up-and-down state tracking unit or any other unit that executes a method that is an aspect of the present invention.

Further more the circuits implementing the methods can be optical, electrical, chemical, molecular, mechanical, quantum-mechanical in nature or apply any phenomenon that implements an n-valued truth table.

The methods which are aspects of the present invention can be provided as a set of instructions in software to be executed by a processor. The set of instructions can be stored on a storage medium such as an optical disk, a magnetic disk or tape, a flash memory or in any form or on any medium that can store data.

While there have been shown, described and pointed out fundamental novel features of the invention as applied to preferred embodiments thereof, it will be understood that various omissions and substitutions and changes in the form and details of the devices and methods as illustrated and in its operation may be made by those skilled in the art without departing from the spirit of the invention. It is the intention, therefore, to be limited only as indicated by the scope of the claims appended hereto.

The invention claimed is:

1. A method for correcting an n-valued symbol in error in an n-valued codeword of a (p,k) code having p n-valued symbols of which k n-valued symbols are information symbols and (p−k) symbols are check symbols with p>1, n>2 and k>1, comprising:
    receiving by a processor of the n-valued codeword that is a Reed-Solomon codeword wherein each n-valued symbol in the n-valued codeword is represented by a signal;
    determining by the processor of a location of the n-valued symbol in error in the n-valued codeword based on check symbols in the n-valued codeword;
    selecting by the processor of a pre-determined n-valued expression from a plurality of pre-determined expressions based on the location of the n-valued symbol in error; and
    calculating by the processor a correct value of the n-valued symbol in error by evaluating the predetermined n-valued expressions which applies one or more of the p n-valued symbols not in error as an input variable and wherein the predetermined n-valued expression applies at least one n-valued logic function and outputs the correct value of the n-valued symbol in error.

2. The method as claimed in claim 1, further comprising:
    locating by the processor of the n-state symbol in error in the n-state codeword by determining a plurality of intermediate comparative coding states associated with the Reed-Solomon codeword.

3. The method as claimed in claim 1, wherein determining the location of the symbol in error is performed by calculating a syndrome.

4. The method as claimed in claim 1, further comprising determining that errors have not occurred exclusively in a check symbol.

5. The method as claimed in claim 1, wherein the n-valued expression uses addition and multiplication over GF(n).

6. The method as claimed in claim 5, wherein $n=2^m$ and m is an integer greater than 1, an n-valued symbol is represented by a plurality of binary symbols, and the addition and multiplication over GF(n) are executed by binary functions.

7. The method as claimed in claim 1, wherein each codeword of the (p,k) code has at most k symbols in common in corresponding positions with any other codeword of the (p,k) code.

8. The method as claimed in claim 1, wherein each codeword of the (p,k) code has at most (k−1) symbols in common in corresponding positions with any other codeword of the (p,k) code.

9. The method as claimed in claim 1, wherein a check symbol in the codeword is created by executing a check symbol determining n-valued expression.

10. The method as claimed in claim 9, wherein each check symbol is represented by a plurality of binary symbols and is created by applying a binary logic function.

11. The method of claim 1, wherein the method is used in a receiver of a communication system.

12. An apparatus for correcting an n-valued symbol in error in an n-valued codeword of a (p,k) code having p n-valued symbols of which k n-valued symbols are information symbols and (p–k) symbols are check symbols with p>1, n>2 and k>1, comprising:
   a processor executing instructions to perform the steps of:
      receiving the n-valued codeword that is a Reed-Solomon codeword wherein each n-valued symbol in the n-valued codeword is represented by a signal and an n-valued symbol is in error with an unknown location in the Reed-Solomon codeword;
      determining the location of the n-valued symbol in error in the n-valued Reed-Solomon codeword;
      selecting a predetermined n-valued expression based on the location of the n-valued symbol in error from a plurality of predetermined expressions; and
      determining a correct value of the n-valued symbol in error by evaluating the predetermined n-valued expression which applies one or more of the p n-valued symbols not in error directly as an input variable and wherein the pre-determined n-valued expression applies at least one n-valued logic function and outputs the correct value of the n-valued symbol in error.

13. The apparatus as claimed in claim 12, further performing the step of determining that errors have not occurred exclusively in a check symbol.

14. The apparatus of claim 12, wherein the apparatus in a storage device.

15. A system for processing a (p,k) codeword having p n-valued symbols of which k n-valued symbols are information symbols and (p–k) symbols are check symbols with p>1, n>2 and k>1, the codeword having a symbol in error, comprising:
   a receiver which receives the p symbols of the (p,k) codeword;
   a processor performing the steps of:
      receiving the (p,k) codeword that is a Reed-Solomon codeword wherein each n-valued symbol in the n-valued codeword is represented by a signal and an n-valued symbol is in error with an unknown location in the Reed-Solomon codeword;
      determining the location of the n-valued symbol in error in the Reed-Solomon codeword; and
      calculating a correct value of the n-valued symbol in error by non-iteratively evaluating a single predetermined n-valued expression that is selected from a plurality of at least three predetermined n-valued expressions based on the location of the n-valued symbol in error, the selected single predetermined n-valued expression outputting the correct value.

16. The system as claimed in claim 15, wherein the system is a communication system.

17. The system as claimed in claim 15, wherein the system is a data storage system.

18. The system of claim 15, wherein the processor locates the n-state symbol in error in the n-state codeword by determining a plurality of intermediate comparative coding states.

* * * * *